(12) United States Patent
Park et al.

(10) Patent No.: US 9,502,532 B2
(45) Date of Patent: Nov. 22, 2016

(54) METHODS OF MANUFACTURING SEMICONDUCTOR DEVICES

(71) Applicant: Samsung Electronics Co., Ltd., Suwon-si (KR)

(72) Inventors: Hong Bum Park, Seoul (KR); Dong Chan Suh, Yongin-si (KR); Kwan Heum Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/707,144

(22) Filed: May 8, 2015

(65) Prior Publication Data

US 2016/0020301 A1    Jan. 21, 2016

(30) Foreign Application Priority Data

Jul. 21, 2014  (KR) .................... 10-2014-0092027

(51) Int. Cl.
  *H01L 29/66* (2006.01)
  *H01L 21/336* (2006.01)
  *H01L 29/78* (2006.01)
  *H01L 29/165* (2006.01)

(52) U.S. Cl.
  CPC ....... *H01L 29/66636* (2013.01); *H01L 29/165* (2013.01); *H01L 29/665* (2013.01); *H01L 29/66795* (2013.01); *H01L 29/7834* (2013.01); *H01L 29/7848* (2013.01)

(58) Field of Classification Search
  CPC ............... H01L 29/66636; H01L 29/66795; H01L 29/785; H01L 29/7848; H01L 21/02369; H01L 21/823814; H01L 21/823821

USPC .......... 257/190, 192, 369, E21.431, E21.43; 438/300, 308, 285
See application file for complete search history.

(56) References Cited

U.S. PATENT DOCUMENTS

| 6,368,949 B1 | 4/2002 | Chen et al. |
| 7,842,566 B2 | 11/2010 | Lee et al. |
| 2002/0109456 A1* | 8/2002 | Morii et al. ............. 313/504 |
| 2006/0057810 A1* | 3/2006 | Smith et al. ............. 438/300 |

(Continued)

FOREIGN PATENT DOCUMENTS

| JP | 2005-353655 | 12/2005 |
| JP | 2006-140320 | 6/2006 |

(Continued)

*Primary Examiner* — Fernando L Toledo
*Assistant Examiner* — Aaron Gray
(74) *Attorney, Agent, or Firm* — Myers Bigel, P.A.

(57) ABSTRACT

Provided is a method of manufacturing a semiconductor device including: forming a gate electrode structure on an active region of a semiconductor substrate; forming recesses in regions positioned on both sides of the gate electrode structure on the active region; performing a pre-treatment on the recesses using an inert gas plasma; growing epitaxial layers for a source and a drain on the pre-treated recesses; and forming a source electrode structure and a drain electrode structure in the epitaxial layers for the source and the drain, respectively. Also provided is a method in which, after an etching process for forming recesses and/or after an etching process for forming a contact hole, an etched surface may be treated with an inert gas plasma before growing an epitaxial layer. Thus, one or two types of plasma treatment may be employed in the method.

20 Claims, 42 Drawing Sheets

(56) References Cited

U.S. PATENT DOCUMENTS

| | | |
|---|---|---|
| 2006/0102962 A1 | 5/2006 | Saito |
| 2007/0173025 A1 | 7/2007 | Akamatsu |
| 2008/0146034 A1* | 6/2008 | Shen et al. .................. 438/700 |
| 2011/0003450 A1* | 1/2011 | Lee et al. .................... 438/285 |
| 2011/0147840 A1 | 6/2011 | Cea et al. |
| 2011/0230027 A1* | 9/2011 | Kim et al. .................... 438/285 |
| 2012/0168913 A1 | 7/2012 | Toh et al. |
| 2013/0056795 A1 | 3/2013 | Wu et al. |
| 2013/0193526 A1 | 8/2013 | Lo et al. |
| 2013/0228862 A1 | 9/2013 | Lee et al. |
| 2013/0248948 A1 | 9/2013 | Ma et al. |
| 2014/0191298 A1* | 7/2014 | Chen et al. .................. 257/288 |
| 2015/0111359 A1* | 4/2015 | Tsai et al. ................... 438/301 |

FOREIGN PATENT DOCUMENTS

| | | |
|---|---|---|
| JP | 2007-149840 | 6/2007 |
| JP | 2007-165429 | 6/2007 |
| JP | 2007-201063 | 8/2007 |
| KR | 10-2000-0040108 | 7/2000 |
| KR | 10-2001-0059464 | 7/2001 |
| KR | 10-2005-0015109 | 2/2005 |
| KR | 10-0632047 | 10/2006 |
| KR | 10-2007-0070890 | 7/2007 |
| KR | 10-2010-0113317 | 10/2010 |

* cited by examiner

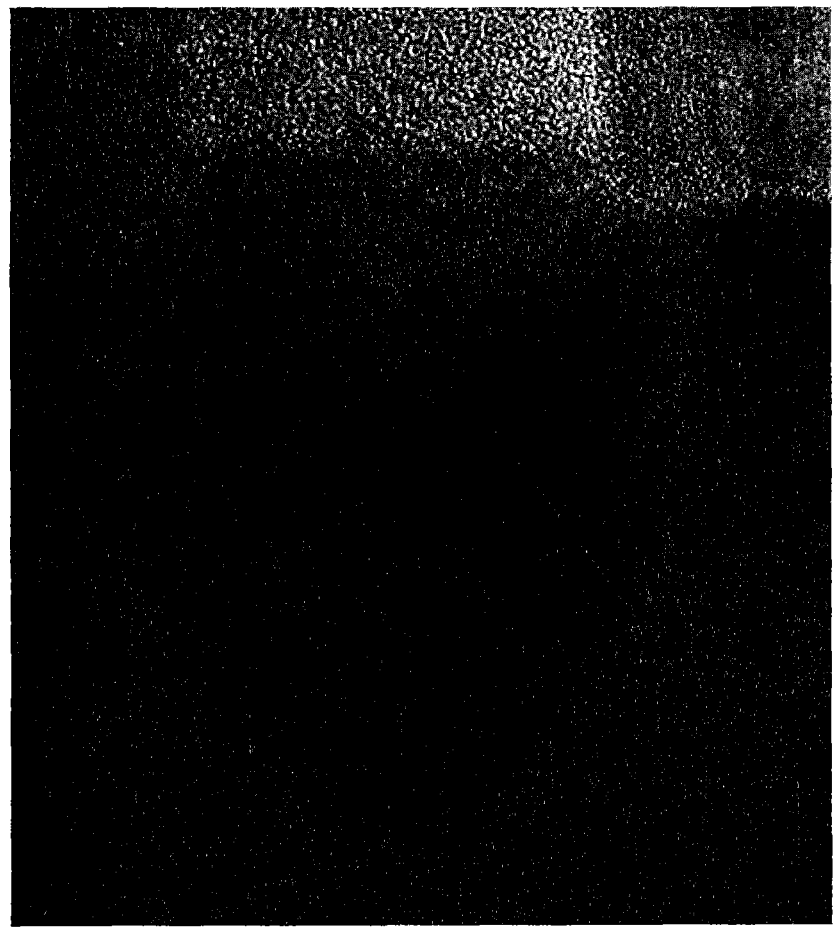
FIG. 35C
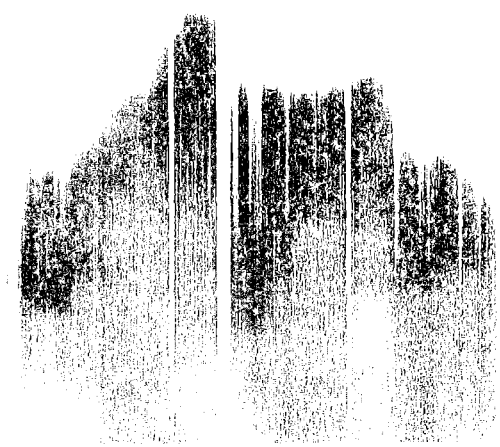

METHODS OF MANUFACTURING SEMICONDUCTOR DEVICES

CROSS-REFERENCE TO RELATED APPLICATION

This application claims the benefit of and priority under 35 U.S.C. §119 to Korean Patent Application No. 10-2014-0092027 filed on Jul. 21, 2014, with the Korean Intellectual Property Office, the entire disclosure of which is incorporated herein by reference.

FIELD

The present disclosure relates to a semiconductor device such as a field effect transistor.

BACKGROUND

When a selective epitaxial growth process is applied to an etched surface during a semiconductor manufacturing process desired epitaxial growth may be difficult to obtain due to impurities adsorbed to and/or solidified in the surface and/or due to lattice damage. This has acted as an obstacle in the manufacturing of various semiconductor devices.

Meanwhile, demand for high levels of integration and high degrees of performance has continuously fueled the reduction in the sizes of complementary metal oxide silicon (CMOS) field effect transistors (FETs). However, as transistors are reduced in size due to short channel effects, it is increasingly difficult to enhance the performance thereof. Thus, research into the improvement of carrier mobility in a channel region has actively been conducted to improve transistor performance.

SUMMARY

An aspect of the present disclosure relates to a method of manufacturing a semiconductor device allowing for a pre-treatment of a contaminated surface of a semiconductor and growing high quality epitaxial layer thereon, in selectively growing or regrowing an epitaxial layer.

According to an example embodiment, a method of manufacturing a semiconductor device may include: forming a gate electrode structure on an active region of a semiconductor substrate; forming recesses in regions positioned on both sides of the gate electrode structure on the active region of the semiconductor substrate; performing a pre-treatment on the recesses using an inert gas plasma to provide pre-treated recesses; growing an epitaxial layer on each of the pre-treated recesses; and forming an electrode structure on the epitaxial layer.

The active region of the semiconductor substrate may include silicon or silicon germanium. The epitaxial layer may include a silicon germanium epitaxial layer. The silicon germanium epitaxial layer may be doped with a p-type impurity.

The inert gas plasma may include at least one of argon (Ar) and xenon (Xe). The inert gas plasma may be generated by applying power in a range of 800 kW to 4000 kW. The pre-treatment may be performed on the recesses for a period of time in a range of 10 seconds to 300 seconds.

After forming the recesses, residues may remain on surfaces of the recesses, and the method may further include: cleaning the residues before the pre-treatment.

After the pre-treatment, the method may further include: oxidizing or nitrificating surfaces of the pre-treated recesses to provide oxidized or nitrificated surfaces and cleaning the oxidized or nitrificated surfaces.

The active region may have an active fin structure having an upper surface and two opposing lateral surfaces, and the gate electrode structure may intersect the active fin structure and may be in contact with the upper surface and the two opposing lateral surfaces of the active fin structure.

According to an example embodiment, a method of manufacturing a semiconductor device may include: forming a gate electrode structure on an active region of a semiconductor substrate; forming recesses in regions positioned on both sides of the gate electrode structure on the active region of the semiconductor substrate; growing a first epitaxial layer on each of the recesses; forming an interlayer dielectric (ILD)(or an interlayer insulating layer) on the semiconductor substrate to cover the active region of the semiconductor substrate; forming a contact hole on the interlayer dielectric, the contact hole being connected to the first epitaxial layer; performing a pre-treatment on a contact area of the first epitaxial layer exposed by the contact hole with an inert gas plasma to provide a pre-treated contact area of the first epitaxial layer; growing a second epitaxial layer on the pre-treated contact area of the first epitaxial layer; and forming an electrode structure in the second epitaxial layer.

The active region of the semiconductor substrate may include silicon or silicon germanium. At least one of the first and second epitaxial layers may include a silicon germanium epitaxial layer. The silicon germanium epitaxial layer may be doped with a p-type impurity.

The first epitaxial layer may be $Si_{1-x}Ge_x$ and the second epitaxial layer may be $Si_{1-y}Ge_y$, wherein the content of germanium of the second epitaxial layer, y, may be greater than the content of germanium of the first epitaxial layer, x. In some embodiments, when the first epitaxial layer is $Si_{1-x}Ge_x$ and the second epitaxial layer is $Si_{1-y}Ge_y$, the value of x and y may be as follows: $0<x<y<1$.

Between forming the recesses and growing the first epitaxial layer, the method may further include: performing a pre-treatment on the recesses using an inert gas plasma. The inert gas plasma used to pre-treat the recesses may be the same as or different than the inert gas plasma used to pre-treat the contact area of the first epitaxial layer.

The method may include: etching a region of the silicon or silicon germanium semiconductor; performing a pre-treatment on a surface of the etched region by exposing the etched region to an inert gas plasma; and growing a silicon germanium epitaxial layer on the pre-treated surface.

Forming the electrode structure may include forming a silicide layer on the second epitaxial layer and filling the contact hole with an electrode material.

According to an example embodiment, a method of preparing a semiconductor substrate for a selective epitaxial growth process may include: providing a semiconductor substrate comprising a gate electrode structure and at least two recesses, the at least two recesses on opposing sides of the gate electrode structure; pre-treating the at least two recesses with a first inert gas plasma to provide at least two pre-treated recesses; and growing an epitaxial layer on the at least two pre-treated recesses.

The inert gas plasma may include helium, argon, and/or xenon. The semiconductor substrate may include silicon or silicon germanium.

The method may further include pre-treating a surface of the epitaxial layer with a second inert gas plasma. Pre-treating the at least two recesses with the first inert gas plasma and/or pre-treating the surface of the epitaxial layer with the second inert gas plasma may include applying power in a range of 800 kW to 4000 kW. The first inert gas plasma may be the same as or different than the second inert gas plasma.

The foregoing technical solutions do not fully enumerate all of the features of the present inventive concepts. The foregoing and other objects, features, aspects and advantages of the present inventive concepts will become more apparent from the below detailed description of the present inventive concepts when taken in conjunction with the accompanying drawings.

BRIEF DESCRIPTION OF DRAWINGS

The above and other aspects, features and advantages of the present inventive concepts will become more apparent in view of the attached drawings and accompanying detailed description. The drawings provided herein represent non-limiting, example embodiments according to various embodiments of the present inventive concepts.

FIGS. 19A through 33A are perspective views schematically illustrating major processes in a method of manufacturing a semiconductor device according to various embodiments of the present inventive concepts.

FIGS. 19B through 33B are cross-sectional views of the semiconductor device respectively illustrated in FIGS. 19A through 33A according to various embodiments of the present inventive concepts.

FIGS. 35A through 35C are transmission electron microscope (TEM) photographs illustrating selective SiGe growth results after recess etching according to various embodiments of the present inventive concepts.

DETAILED DESCRIPTION

Figure 1:
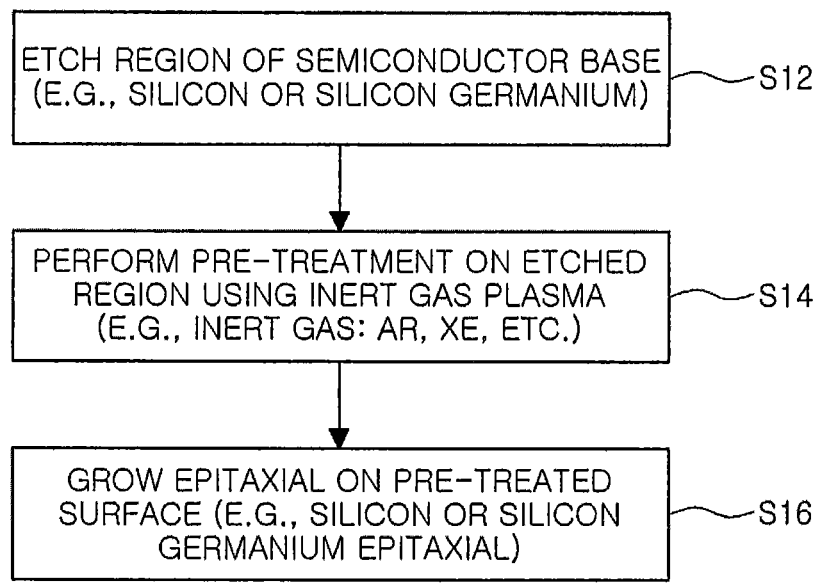
FIG. 1 is a flow chart illustrating an epitaxial growth method according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing.

Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a flow chart illustrating a selective epitaxial growth (SEG) method according to various embodiments of the present inventive concepts.

Referring to FIG. 1, the method may start with operation S12 of etching a region of a semiconductor base.

The semiconductor base may be a single crystal for epitaxial growth. For example, the semiconductor base may be silicon (Si) or silicon germanium (SiGe). In order to manufacture a semiconductor device for implementing a particular function, a particular region of the semiconductor base may be selectively etched. The selective etching may be conducted as dry etching or wet etching. An impurity due to a reaction outcome with an etchant may remain on a surface of an etched region. Also, since an impact may be applied to a surface of the crystal, lattice damage may occur.

Subsequently, the surface of the etched region undergoes a pre-treatment by using an inert gas plasma in operation S14.

During this process, an inert gas plasma is excited within a chamber and the surface of the etched region may be exposed to the inert gas plasma. A plasma source used in this process may be an inert gas such as helium (He), argon (Ar), and/or xenon (Xe). If necessary, a gas, such as $N_2$ or $H_2$, may be mixed with He, Ar, and/or Xe and used in the process. During this process, impurities may be removed from the surface of the region employed and etched before an epitaxial growth, and a damaged lattice may be cured.

Next, an epitaxial layer may be selectively grown on the pre-treated surface in operation S16. Here, since the epitaxial layer may be grown on a surface in which crystallographic orientation is secured and from which impurities have been removed, a high quality epitaxial layer may be grown.

The selective epitaxial growth (SEG) may be variously modified to be implemented. For example, the SEG may be combined with any other cleansing process and/or curing process to further enhance an effect based on plasma processing. Another embodiment of the SEG is illustrated in FIGS. 2A through 2F.

Figure 2A:
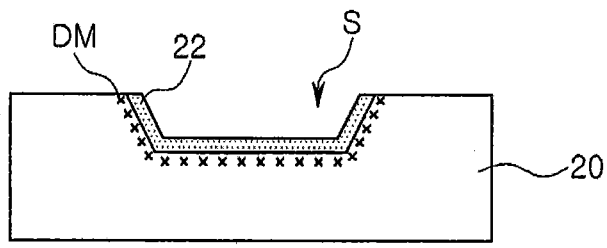
FIGS. 2A through 2F are cross-sectional views illustrating major processes in a selective epitaxial growth method according to various embodiments of the present inventive concepts.

As illustrated in FIG. 2A, a region S of a semiconductor base 20 may be etched.

The etched region S may define a selective epitaxial growth region in a follow-up process. The semiconductor base 20 may be silicon or silicon germanium. A residue 22, as an outcome of a reaction with an etchant used for the selective etching, may remain on the surface. A partial amount of impurities may be adsorbed onto a surface of the etched region S and/or solidified even in an adjacent interior to remain in a surface region DM. Since a physical or chemical impact occurs on the surface region DM during an etching process, lattice damage may occur.

Figure 2B:
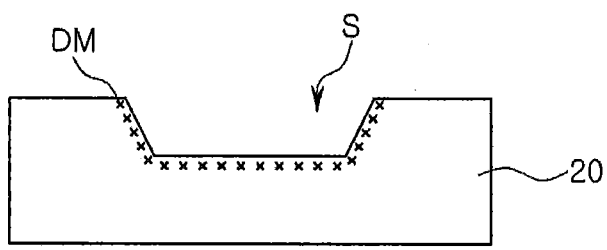

As illustrated in FIG. 2B, the etched region S may be cleaned to remove the residue 22.

The residue 22 may exist on the surface of the etched region S in a previous process. This process may be performed through dry etching using an etching gas such as SiCoNi or wet cleaning using an HF etchant. Even after the residue 22 is removed, impurities such as carbon (C), nitrogen (N), and oxygen (O), may remain in the etched region S. Also, impurities which have adsorbed onto and/or solidified in the damaged surface region DM may not be removed through a general cleaning process. Also, even after the cleaning operation, the lattice-damaged surface region DM may remain with the damaged lattice without having been repaired.

Figure 2C:
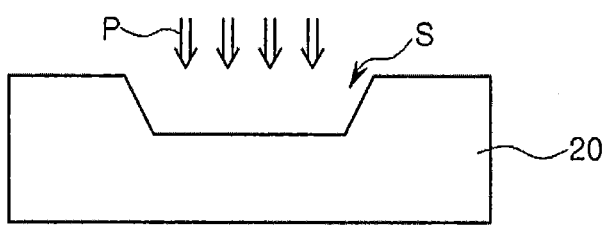

As illustrated in FIG. 2C, the surface of the etched region S may undergo a pre-treatment using an inert gas plasma P.

In general, curing is performed to enhance crystallinity during a heat treatment process, but it may be difficult to apply a high temperature heat treatment process. For example, in a case in which a material having a low melting point such as, for example, silicon germanium (SiGe), is used as a material of the semiconductor base 20 or in a case in which any other peripheral elements are vulnerable to a high temperature environment, lattice damage cannot be cured through a high temperature heat treatment process.

In order to solve this problem, a surface treatment process using an inert gas plasma may be applied to the etched region S. The plasma surface treatment may be performed by exciting an inert gas plasma within a process chamber and exposing a surface of an etched region S to a gas plasma. Through the plasma treatment, damaged lattice in the surface region DM may be cured and impurities may be effectively removed. The plasma source used in this process may be an inert gas such as helium (He), argon (Ar), and/or xenon (Xe).

Figure 2D:
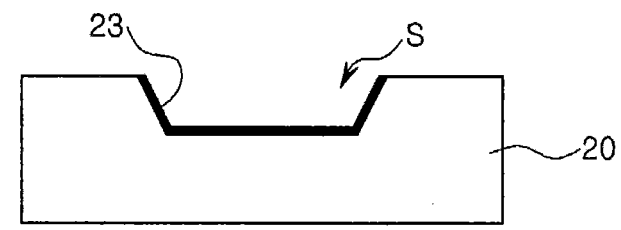
Figure 2E:
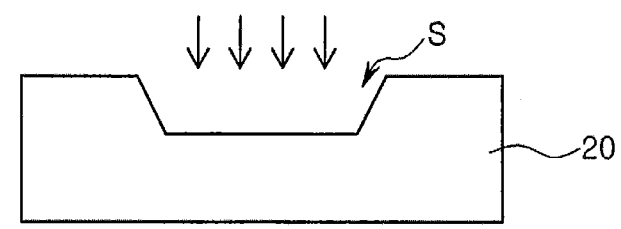

As illustrated in FIGS. 2D and 2E, in order to additionally cure the damaged lattice on the surface of the pre-treated region S, oxidation or nitrification may be applied. An oxide film or a nitride film 23 formed through the oxidation or nitrification may be removed through a simple cleaning process (e.g., a cleaning process using an HF etchant).

Figure 2F:
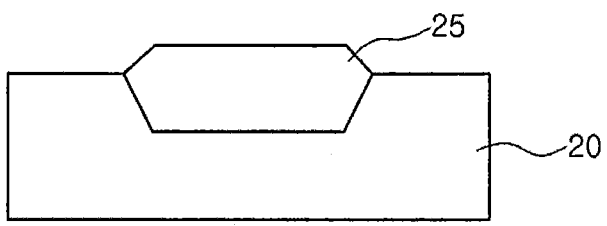

As illustrated in FIG. 2F, an epitaxial layer 25 may be selectively grown in the pre-treated region S.

Impurities of the etched region S have been removed through plasma treatment and crystallographic orientation of the etched region S has been recovered, and thus, the selective epitaxial growth process may be smoothly performed. The epitaxial layer 25 may be formed of a material substantially identical to that of the semiconductor base 20. For example, both the semiconductor base 20 and the epitaxial layer 25 may be formed of silicon germanium. Also, the epitaxial layer 25 may be formed of a material different from that of the semiconductor base 20. For example, silicon germanium may be grown as the epitaxial layer 25 on the semiconductor base 20 formed of silicon.

The SEG process using the plasma pre-treatment described above may be advantageously applied to a process of manufacturing various semiconductor devices employing the SEG process. For example, the SEG process using the plasma pre-treatment may be employed in a process for manufacturing a field effect transistor (FET).

In an FET, when a certain bias voltage is applied, a channel region may be formed in a semiconductor substrate below a gate electrode. Major carriers move through the channel region, and operational characteristics of the FET may be determined depending on carrier mobility.

In order to enhance carrier mobility, a method of changing an energy band structure of a channel region by applying physical stress thereto may be used. For example, in the case of a PMOS transistor in which holes are major carriers, compressive stress may be applied to a channel region to enhance hole mobility.

In detail, by growing a semiconductor material having lattice greater than that of a semiconductor substrate (in particular, an active region) on both sides of the channel region, namely, in source and drain regions, compressive stress may be applied to the channel region. In order to implement this structure, the SEG process may be applied.

Figure 3:
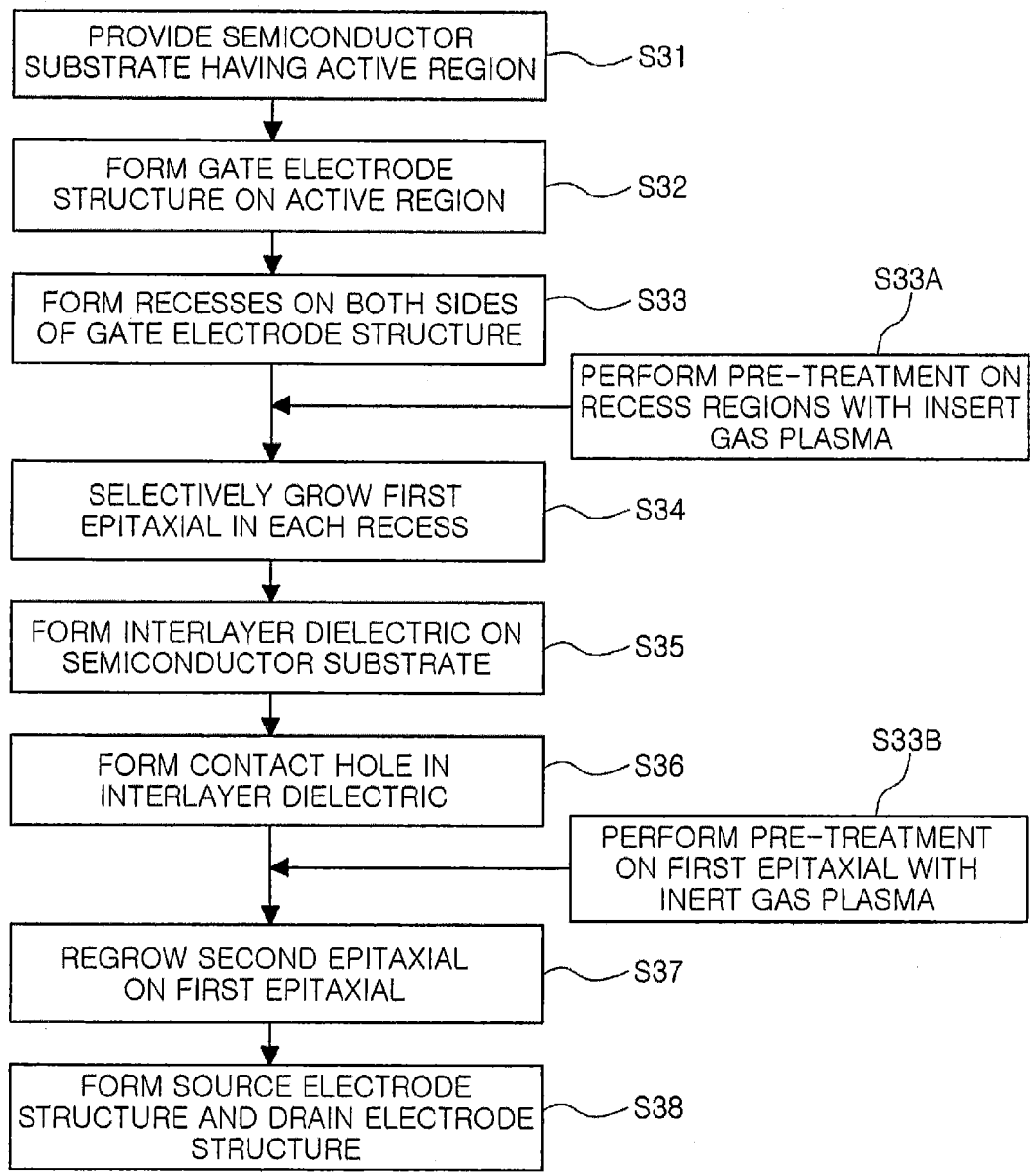
FIG. 3 is a flow chart illustrating a method of manufacturing a semiconductor device according to various embodiments of the present inventive concepts.

FIG. 3 is a flow chart illustrating a process of manufacturing an FET according to various embodiments of the present inventive concepts. A point in time at which a pre-treatment using plasma is performed in a method of manufacturing an FET as an example of a semiconductor device will be described with reference to FIG. 3.

Referring to FIG. 3, the manufacturing method may start with operation S31 of providing a semiconductor substrate having an active region. An active region may be formed of silicon or silicon germanium. In case of a P-MOSFET, the active region may be provided as an n-type well.

A gate electrode structure may be formed on the active region of the semiconductor substrate in operation S32. If necessary, an impurity region defining a source and a drain may be formed using the gate electrode structure. In the case of a P-MOSFET, the impurity region may be a region doped with a p-type impurity such as boron (B).

Subsequently, recesses may be formed in portions of the active region positioned on both sides of the gate electrode structure in operation S33. When the impurity region is formed in advance, the recesses may be formed to have a depth lower than that of the impurity region.

Thereafter, a first epitaxial layer may be grown in the recesses in operation S34. The first epitaxial layer may be a region doped with an impurity. In the case of a P-MOSFET, the first epitaxial layer may be an epitaxial doped with a p-type impurity such as boron (B). The first epitaxial layer may be silicon germanium. Silicon germanium may act as a stresser applying compressive stress to the channel region.

Subsequently, an interlayer dielectric (ILD) (or an interlayer insulating layer) is formed on the semiconductor substrate to cover the active region in operation S35, and a contact hole may be formed in the interlayer dielectric such that the contact hole is connected to the first epitaxial layer in operation S36. The first epitaxial layer has a contact area exposed by the contact hole. Subsequently, through the contact hole, a second epitaxial layer may be regrown on the contact area of the first epitaxial layer in operation S37. When the first epitaxial layer is a silicon epitaxial having a first germanium concentration, the second epitaxial layer may be a silicon epitaxial having a second germanium concentration. Thereafter, a source electrode structure and a drain electrode structure may be formed in the second epitaxial layer in operation S38.

In the method of manufacturing an FET as illustrated in FIG. 3, a plasma treatment before the SEG may be employed at two points in time, namely, after an etching process for forming recesses and/or after an etching process for a contact hole. In detail, first, the recess regions may be surface-treated using an inert gas plasma in operation S33A, after operation S33 of forming the recesses and before operation S34 of selectively growing the first epitaxial layer. Second, a pre-treatment using an inert gas plasma may be performed on the contact area of the first epitaxial layer exposed through the contact hole in operation S33B, after operation S36 of forming the contact hole and before operation S37 of selectively growing the second epitaxial layer. In various embodiments of the present inventive concepts (e.g., FIGS. 5 through 12 or FIGS. 13 through 18), only one of the two types of plasma treatment processing may be employed, and in other embodiments of the present inventive concepts (e.g., FIGS. 19A through 34), the two types of plasma treatment processing may be employed even in a single manufacturing process.

Figure 4:
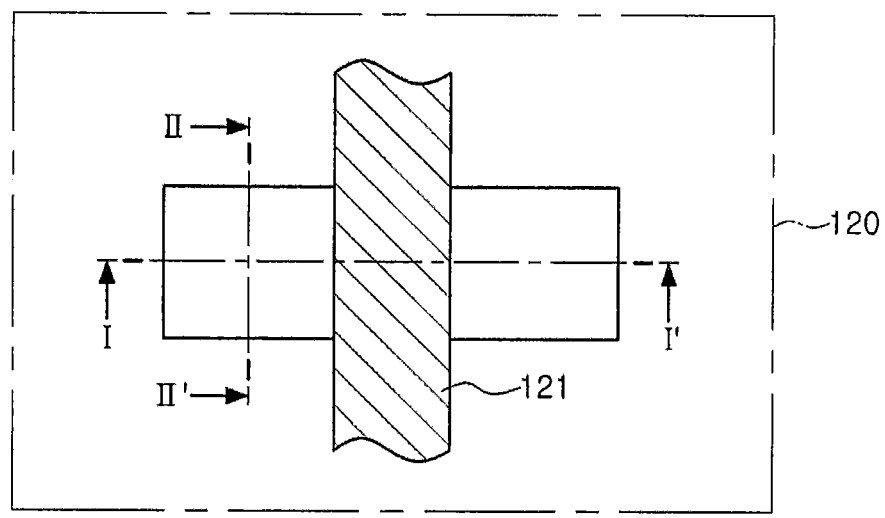
FIG. 4 is a plan view illustrating a semiconductor device according to various embodiments of the present inventive concepts.

FIG. 4 is a plan view illustrating a semiconductor device according to various embodiments of the present inventive concepts, and FIGS. 5 through 12 are cross-sectional views of the semiconductor device illustrated in FIG. 4, taken along lines I-I' and II-II', illustrating major processes in a method of manufacturing a semiconductor device according to various embodiments of the present inventive concepts.

Figure 5:
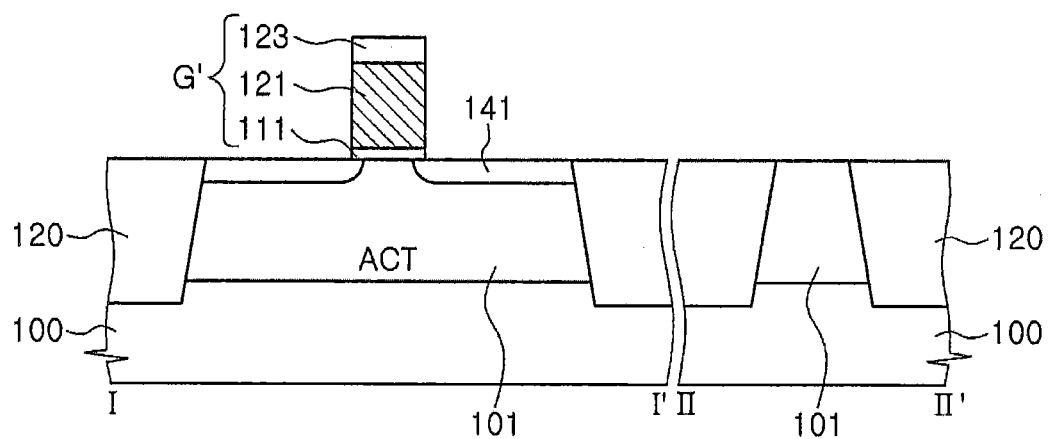
FIGS. 5 through 12 are cross-sectional views of the semiconductor device illustrated in FIG. 4, taken along lines I-I' and illustrating major processes in a method of manufacturing a semiconductor device according to various embodiments of the present inventive concepts.

Referring to FIG. 5 together with FIG. 4, a gate electrode structure G' may be formed on an active region ACT of the semiconductor substrate 100.

The semiconductor substrate 100 employed in this example embodiment may be a single crystal silicon substrate. For example, the semiconductor substrate 100 may be a silicon substrate having the (100) plane. Alternatively, the semiconductor substrate 100 may be a silicon-on-insulator (SOI) substrate, a germanium (Ge) substrate, a germanium-on-insulator (GOI) substrate, or a silicon-germanium substrate.

The active region ACT 101 may be silicon or silicon germanium. The active region ACT 101 may be formed by an isolation layer 120. The isolation layer 120 may be formed by forming a trench in the semiconductor substrate 100 and embedding the trench with an insulating material. The insulating material filling the trench may have excellent gap fill characteristics. For example, the insulating material may be boron-phosphor silicate glass (BPSG), high density plasma (HDP) oxide, undoped silicate glass (USG), or tonen silazene (TOSZ).

The semiconductor substrate 100 may include a well region doped with an impurity to form MOS transistors. According to an example embodiment, the semiconductor substrate 100 may include an n-type well for forming PMOS transistors.

In this stage, the gate electrode structure G' may include a gate insulating layer 111, a gate electrode 121, and a capping layer 123 sequentially disposed on the active region ACT 101. The gate insulating layer 111 may include at least one of a silicon oxide layer, a silicon nitride layer, a silicon oxynitride layer, and a high dielectric layer. The high dielectric layer may refer to insulating materials having a dielectric constant higher than that of a silicon oxide film, and may include a tantalum oxide film, a titanium oxide film, a hafnium oxide film, a zirconium oxide film, an aluminum oxide film, an yttrium oxide film, niobium oxide film, a cesium oxide film, an indium oxide film, an iridium oxide film, barium strontium titanate (BST) film, and a zerconate titanate (PZT) film. The gate insulating layer 111 may be a single layer or may include a plurality of layers as needed.

The gate electrode 121 may be disposed on the gate insulating layer 111 and may traverse the active region ACT 101. For example, the gate electrode 121 may be formed of a polysilicon (poly-Si) film doped with an impurity. In the case of a PMOS transistor as in this example embodiment, the gate electrode 121 may include a polysilicon film doped with a p-type impurity. Alternatively, the gate electrode 121 may be formed of a conductive material having relatively low resistivity and a high work function. For example, the gate electrode 121 may be formed of at least one metal (for example, tungsten (W) and/or molybdenum (Mo)) and/or conductive metal compound (for example, a titanium nitride, a tantalum nitride, a tungsten nitride, and/or a titanium aluminum nitride).

In addition, as illustrated in FIG. 5, low impurity concentration regions 141 may be formed on both sides of the gate electrode structure G' in the active region ACT 101. In the case of the PMOS transistor as in this example embodiment, the low impurity concentration region 141 may be doped with a p-type impurity such as boron (B). The low impurity concentration region 141 may be formed through an ion implantation process using the gate electrode structure G' without a spacer (130 of FIG. 6) as a mask. A portion of the low impurity concentration region 141 may extend to a lower side of the gate electrode structure G by impurity diffusion. The low impurity concentration region 141 formed in this stage may be provided as an impurity region for source and drain regions together with a high impurity concentration region (143 of FIG. 6) to be formed in a follow-up process.

If necessary, after the low impurity concentration region 141 is formed, a halo ion implantation process may be performed to form a channel impurity region (not shown). Here, the channel impurity region may be formed by ion-implanting an n-type impurity (e.g., arsenic (As)) having a conductivity type opposite to that of the source and drain regions. The channel impurity region may increase carrier concentration of the active region ACT below the gate electrode 121, preventing a punch through phenomenon.

Figure 6:
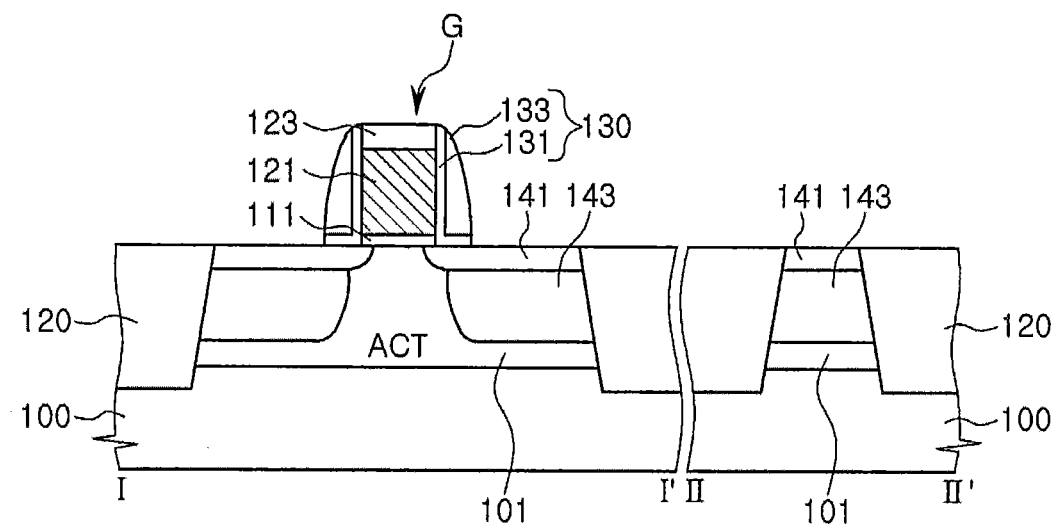

Subsequently, as illustrated in FIG. 6, spacers 130 are formed on both side walls of the gate electrode structure G' illustrated in FIG. 5 to obtain a desired gate electrode structure G The spacers 130 may be provided as a plurality of spacers 131 and 133, and may have a structure in which insulating materials having etching selectivity are alternately stacked.

In detail, in the present example embodiment, the spacers 130 may be formed by conformally depositing an insulating layer over the entire surface of the semiconductor substrate 100 with the gate electrode 121 formed thereon and subsequently performing an anisotropic etching process such as an etch-back process thereon. In more detail, a silicon oxide film and a silicon nitride film are sequentially conformally formed on the entire surface of the semiconductor substrate 100 with the gate electrode 121 formed thereon. The silicon oxide film may be formed through a chemical vapor deposition (CVD) process or a thermal oxidation process. The silicon oxide film may cure etching damage done to a side wall of the gate electrode 121.

Subsequently, the sequentially stacked silicon oxide film and the silicon nitride film are etched back to form dual-spacers 130 having an L-shaped first spacer 131 and a second spacer 133 formed on the first spacer 131 on both side walls of the gate electrode 121. Accordingly, the desired gate electrode structure G may be formed. In the present example embodiment, since the dual-spacers 130 are provided, a short-channel effect that a channel length, a distance between source and drain regions, is reduced due to high integration of a semiconductor device can be resolved.

After the dual-spacers 130 are formed, high impurity concentration regions 143 may be formed within the semiconductor substrate 100 on both sides of the gate electrode structure G The high impurity concentration regions 143 may be formed by implanting p-type dopants, for example, boron (B), using the gate electrode structure G having the spacers 130 as an ion implantation mask. Here, the high impurity concentration regions 143 may be formed to be deeper than recesses ("R" of FIG. 7) to be formed in a follow-up process. Portions of the high impurity concentration regions 143 may also be diffused to a lower side of the spacers 130.

Figure 7:
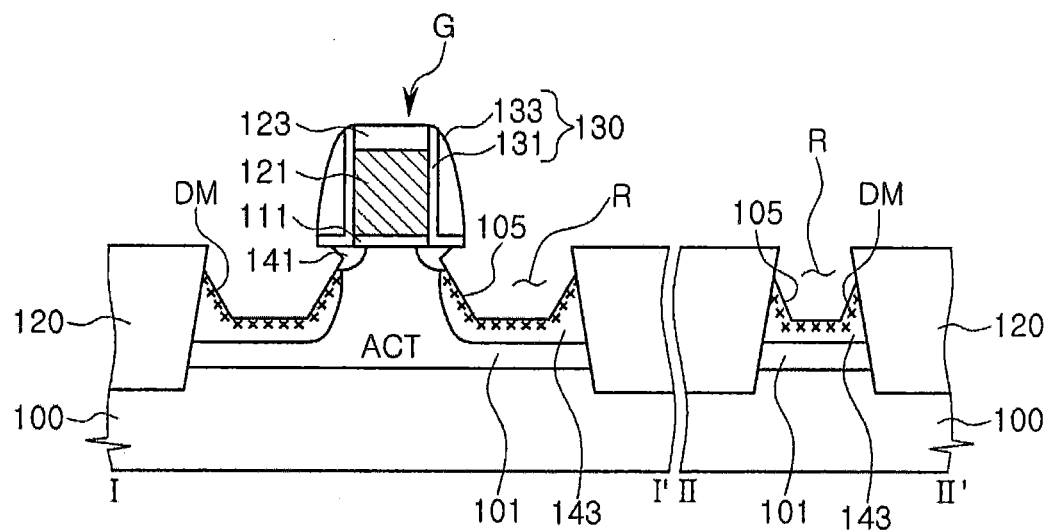

Subsequently, as illustrated in FIG. 7, the active region ACT on both sides of the gate electrode structure G may be selectively etched to form the recesses R.

The recesses R may be formed by anisotropic and/or isotropic-etching the active region ACT on both sides of the gate electrode structure G using the gate electrode structure G as an etching mask. In the present example embodiment, the recesses R may be provided on both sides of the gate electrode 121 and may be defined by lateral surfaces sloped with respect to the bottom surface parallel to the surface of the semiconductor substrate 100 and the surface of the semiconductor substrate 100. Also, when each recess R is formed between the gate electrode 121 and the isolation layer 120, the recess region R may expose a side wall of the isolation layer 120.

When the semiconductor substrate 100 has the (100) plane, the bottom surface of the recess R may have the (100) face, the lateral surface adjacent to the gate electrode structure G may have (111), (110), and (311) planes. In the present example embodiment, the recess R may extend to a lower side of the gate electrode structure G The recess R may expose low concentration and high impurity concentration regions 141 and 143. Alternatively, the recess R may not expose the n well or the semiconductor substrate 100. For example, a depth of the recess R from the surface of the semiconductor substrate 100 may be about 300 Å to about 1000 Å.

As described above, the recess R may be obtained by etching the semiconductor substrate 100 (in particular the active region ACT) using the gate electrode structure G as an etching mask.

In a specific example, a trench may be formed by performing an isotropic or anisotropic dry etching process on the active region ACT using the isolation layer 120 together with the gate electrode structure G as etching masks. Here, HCl, $Cl_2$ and $H_2$ may be used as an etchant. The trench formed by the anisotropic etching process may be thinner than the depth of the recess region R. Subsequently, when isotropic etching is performed by supplying an etching solution, the bottom surface and lateral surfaces of the recess R may be provided as particular crystal planes. In detail, as the etching solution of the isotropic etching process, an organic alkali etchant (tetramethyl ammonium hydroxide (TMAH)) or ammonium hydroxide ($NH_4OH$) may be used. The trench may extend through the isotropic etching process to form the recess region R. Namely, the semiconductor substrate 100 may be etched in a horizontal direction as well as a vertical direction through the isotropic etching process, and in this process, a portion of the recess R may be etched in the semiconductor substrate 100 below the spacer 130.

Meanwhile, when the semiconductor substrate 100 formed of silicon is wet-etched, etching rates are different according to crystal planes and crystal directions of silicon. In detail, an etching rate may differ, depending on crystal planes of silicon. For example, when the silicon substrate is isotropic-etched using ammonium hydroxide ($NH_4OH$), the silicon substrate has characteristics such that an etching rate is slowest in the (111) plane and fastest in the (100) plane.

Thus, in a case in which isotropic etching process is performed using ammonium hydroxide (NH$_4$OH), the (111) plane at the slowest etching rate may define the lateral surfaces of the recess R, and the recess R may have a pointed wedge shape by the two lateral surfaces having (111) plane in the lower portion of the spacer 130.

Alternatively, the recess R may be formed by performing an anisotropic dry etching process such as chemical vapor etching (CVE). In this case, HCl or H$_2$ may be used as an etchant gas.

Through the anisotropic and/or isotropic etching process as described above, an internal region of the recess R adjacent to the surface, as well as the surface of the recess R, may be contaminated by impurities due to the etchant and the crystal may be damaged.

Thus, the surface region DM contaminated and damaged by the etching process may be subject to a cleaning process after the recess R forming process is completed. For example, dry etching using an etchant gas such as SiCoNi or a wet cleaning process using HF or O$_3$ and HF may be used. However, even in the case that a residual layer such as an oxide film present on the surface of the recess R may be removed, impurity elements such as carbon (C), nitrogen (N), and oxygen (O) may be adsorbed onto and/or solidified to remain in the surface and may not be effectively cleaned through the cleaning process. In particular, the lattice-damaged surface region DM may not be effectively cured even after the cleaning operation. Since the residual impurity elements and damaged lattice may be a big obstacle to implementation of a follow-up epitaxial growth, and thus, a pre-treatment using plasma illustrated in FIG. 8 is required.

Figure 8:
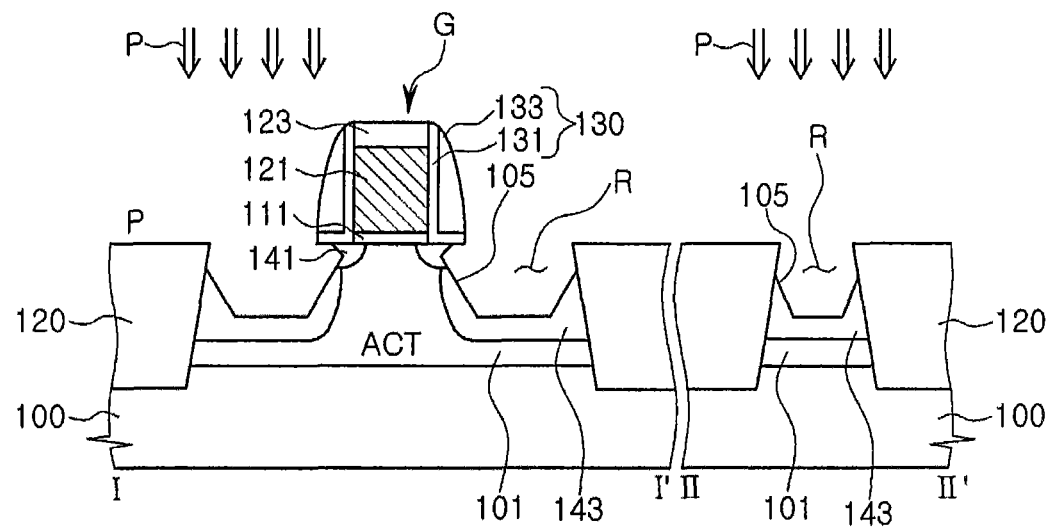

Thereafter, as illustrated in FIG. 8, the recess R may undergo a pre-treatment using an inert gas plasma P.

During this process, power is applied at a predetermined pressure within a process chamber to excite a plasma from an inert gas source, and the recess is exposed to the plasma. The inert gas plasma processing may be performed at low temperatures and a high level of energy may be provided to the damaged surface. Thus, the impurity elements, which were adsorbed onto and/or solidified in the surface and thus have not been removed during a general cleaning process, may be effectively removed and the damaged lattice can be effectively cured. The plasma source used in this process may be an inert gas such as helium (He), argon (Ar), and/or xenon (Xe). If necessary, H$_2$ and/or N$_2$ may be used. In a specific example, argon (Ar) or xenon (Xe) having an atom size larger than that of the sources (He, H$_2$, or N$_2$) may be expected to have a greater effect because argon and/or xenon may affect a deeper region during the plasma processing. The plasma source such as argon (Ar) or xenon (Xe) may be advantageously used in the case of a semiconductor such as SiGe.

In detail, in the case of inert gas plasma, plasma to be used for a pre-treatment may be generated by applying power in a range of 800 kW to 4000 kW. As a power means, DC or AC power, in addition to RF power, may be used. Processing using plasma may be performed at relatively low temperatures (e.g., 600° C. or lower). In a specific example, a pre-treatment using plasma may be performed at 500° C. or lower. The pre-treatment using plasma may be performed at a pressure in a range of 0.1 torr to 10 torr and a pre-treatment may be performed for a period of time in a range of 10 seconds to 300 seconds, but the present disclosure is not limited thereto.

Figure 9:
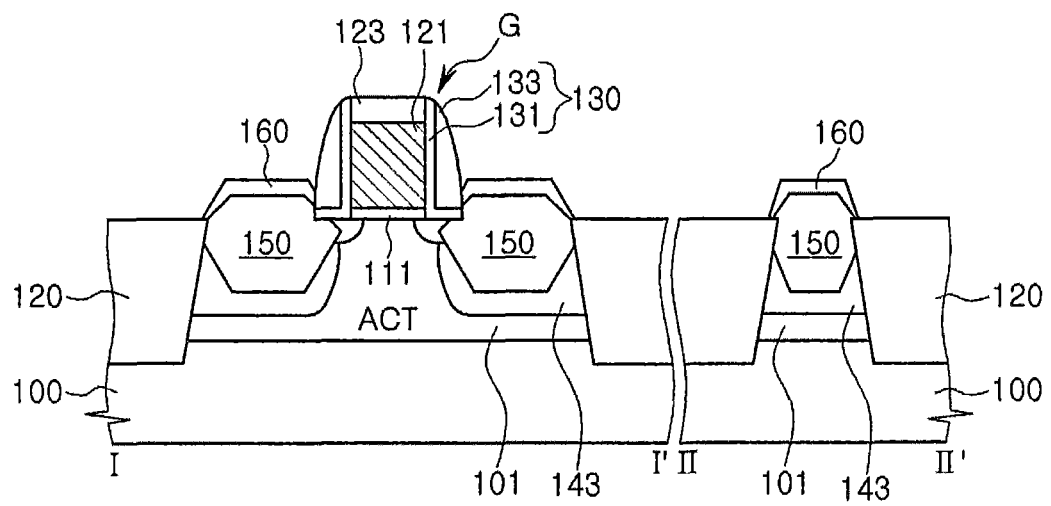

Subsequently, as illustrated in FIG. 9, a selective epitaxial growth (SEG) process may be performed to form an SiGe epitaxial layer 150 within the recess R.

The SiGe epitaxial layer 150 may be selectively grown only in the region exposed to the recess R through the SEG process. Since the recess R has surfaces advantageous for crystal growth by the previous pre-treatment using plasma, an epitaxial having desired quality may be grown during this growth process.

In the case of the PMOS transistor, as in the present example embodiment, the SiGe epitaxial layer 150 having a lattice constant greater than that of silicon of the semiconductor substrate 100 may be formed in order to apply compressive stress to the channel region, as described above. Since the SiGe epitaxial layer 150 is grown on the exposed region of the semiconductor substrate 100, the SiGe epitaxial layer 150 may have a crystal structure substantially identical to that of silicon of the semiconductor substrate 100.

For example, the SiGe epitaxial layer 150 may be formed of silicon germanium (Si$_{1-x}$Ge$_x$, 0<x<1). Since a lattice constant of Ge crystal is greater than that of Si crystal, as the Si element is substituted with a Ge element within the lattice of the silicon crystal, the Si$_{1-x}$Ge$_x$ (0<x<1) lattice may be increased. When the SiGe epitaxial layer 150 is grown in the recess R, compressive stress is generated in the channel region of the PMOS transistor, and since the lattice of the SiGe epitaxial layer 150 is increased as the concentration of Ge is increased, compressive stress applied to the channel region may be increased.

In the present example embodiment, a concentration of Ge may be greater in an upper region of the SiGe epitaxial layer 150 than in a lower region thereof. The lower region of the SiGe epitaxial layer 150 may minimize lattice mismatch with respect to the semiconductor substrate 100, and a high concentration of a desired level may be obtained in the upper region. In this manner, the SiGe epitaxial layer 150 may include the lower region having a low concentration and the upper region having a high concentration. For example, the lower region of the SiGe epitaxial layer 150 may have a thickness in a range of about 20 nm to about 50 nm, and a Ge concentration of the lower region may be in a range of 10% to 30%. The upper region of the SiGe epitaxial layer 150 may have a thickness in a range of about 40 nm to about 60 nm, and a Ge concentration of the upper region may be in a range of 20% to 50%. In a specific example, the Ge concentration of the SiGe epitaxial layer 150 may have a gradient gradually increasing upwardly, such as, for example, from the lower region of the SiGe epitaxial layer 150 to the upper region of the SiGe epitaxial layer 150.

The SiGe epitaxial layer 150 may be grown by any one of solid phase epitaxy (SPE), vapor phase epitaxy (VPE), and liquid phase epitaxy (LPE) methods. For example, as the VPE method, chemical vapor deposition (CVD), reduced pressure chemical vapor deposition (RPCVD), or ultra high vacuum chemical vapor deposition may be used.

A selective growth process of the SiGe epitaxial layer 150 may be performed by simultaneously supplying a selective etching gas together with a silicon source gas and a germanium source gas. The selective etching gas may be supplied together with a silicon source gas so that the SiGe epitaxial layer 150 may not be formed on the isolation layer 120 as an oxide film or a nitride film and may be selectively grown only in the recess region in which silicon (Si) is exposed.

As a silicon source gas, monochlorosilane (SiH$_3$Cl), DCS (dichlorosilane), TCS (trichlorosilane), HCS (hexashlorosilane), SiH$_4$, Si$_2$H$_6$, or any combination thereof may be used. As a germanium source gas, GeH$_4$, Ge$_2$H$_4$, GeH$_3$Cl, Ge$_2$H$_2$Cl$_2$, Ge$_3$HCl$_3$, or any combination thereof may be used. As a selective etching gas, HCl, Cl$_2$, or any combination thereof may be used. A carrier gas may be used in order to allow the foregoing silicon and germanium source gases to be conformally supplied to the surface of the semiconductor substrate 100 during the selective epitaxial growth process. The carrier gas may be at least one of a hydrogen gas, a helium gas, a nitrogen gas, and an argon gas. The process of growing the SiGe epitaxial layer 150 may be performed at a temperature of about 550° C. or higher and at pressure of a few mTorr or higher. Also, a growth rate of the SiGe epitaxial layer 150 may differ, depending on rates of the silicon source gas and the germanium source gas.

In the present example embodiment, through the selective epitaxial growth process, the SiGe epitaxial layer 150 may fill the recess region R having a wedge shape below the spacer 130, and accordingly, compressive stress applied to the channel region may be further increased. The SiGe epitaxial layer 150 may be elevated from above the surface of the semiconductor substrate 100. As the thickness of the SiGe epitaxial layer 150 is increased, compressive stress applied to the channel region may be further increased. For example, an elevated height of the SiGe epitaxial layer 150 may be in a range of about 10 nm to about 40 nm.

The SiGe epitaxial layer 150 may be an epitaxial layer doped with a particular conductivity-type impurity. In the present example embodiment, the particular conductivity-type impurity may be a p-type impurity such as boron (B). Doping the SiGe epitaxial layer 150 with an impurity may be performed by doping a p-type impurity in-situ during the epitaxial growth process. Alternatively, after the selective epitaxial growth, doping the SiGe epitaxial layer 150 with an impurity may be performed by ion-implanting a p-type impurity in the SiGe epitaxial layer 150. The SiGe epitaxial layer 150 doped with a p-type impurity may be provided as source and drain regions together with the low and high impurity concentration regions 141 and 143.

In the present example embodiment, it is illustrated that the SiGe epitaxial layer 150 is elevated from the surface of the semiconductor substrate 100, but the SiGe epitaxial layer 150 may be positioned lower than the surface of the semiconductor substrate 100.

Additionally, as illustrated in FIG. 9, a silicon capping layer 160 may be formed on the SiGe epitaxial layer 150. The silicon capping layer 160 may cover an upper surface of the SiGe epitaxial layer 150. For example, the silicon capping layer 160 may have a thickness in a range of about 10 nm to about 30 nm. The silicon capping layer 160 may be used to form a silicide film in a follow-up process, and during a silicide forming process, the silicon capping layer 160 may serve to prevent a silicide film from penetrating into an interface of the SiGe epitaxial layer 150 to react with the semiconductor substrate 100. The silicon capping layer 160 may be formed through a selective epitaxial growth process similar to that of the SiGe epitaxial layer 150.

Figure 10:
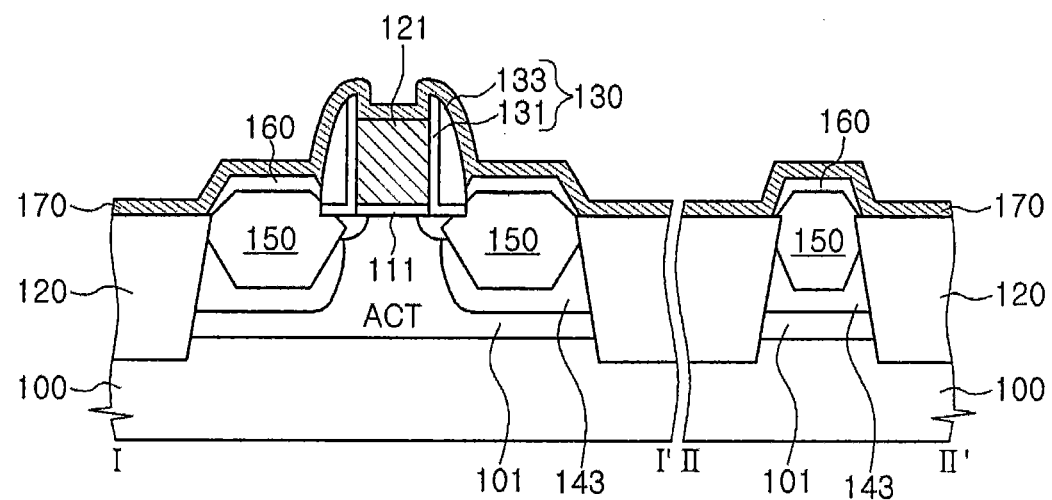
Figure 11:
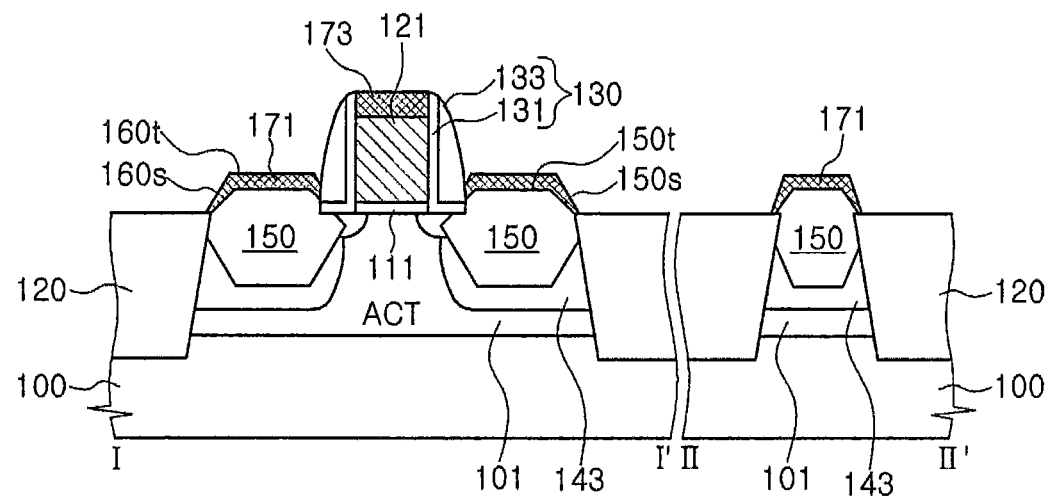

Thereafter, as illustrated in FIGS. 10 and 11, after the formation of the silicon capping layer 160, silicide films 171 and 173 may be formed on the SiGe epitaxial layer 150 and the gate electrode 121, respectively.

The silicide films 171 and 173 may include a silicon element and a metal element. For example, the silicide films 171 and 173 may be any one of a cobalt silicide film, a titanium silicide film, a nickel silicide film, and a tungsten silicide film. The concentration of the silicon element and the metal element in the silicide films 171 and 173 may be 90% or greater. For example, the silicide films 171 and 173 may be nickel silicide films containing nickel ($Ni_xSi_{1-x}$, 0<x<1) reacting with silicon at a temperature lower than that of cobalt and titanium. For example, the silicide films 171 and 173 may be at least one among NiSi, NiSi$_2$, Ni$_3$Si$_2$, Ni$_2$Si, and Ni$_{31}$Si$_{12}$. The nickel silicide films may have specific resistance lower than those of cobalt and titanium silicides. The nickel silicide films may be formed by reacting the silicon capping layer 160 with a nickel film.

The silicide films 171 and 173 may be formed by using a self-aligned silicidation. Namely, a metal film may be formed on silicon, a heat treatment process may be performed to react metal and silicon, and a residual metal which has not been reacted with silicon may be removed.

In detail, as illustrated in FIG. 10, first, after the capping layer 123 on the gate electrode 121 is removed, a metal film 170 is conformally formed on the semiconductor substrate 100 with the gate electrode 121, the SiGe epitaxial layer 150, and the silicon capping layer 160 formed thereon. The metal film 170 may cover an upper surface of the gate electrode 121 and a surface of the SiGe epitaxial layer 150. Here, the metal film 170 may include a high melting point metal (refractory metal) such as cobalt, titanium, nickel, tungsten, and molybdenum. In the present example embodiment, the metal film 170 may be a nickel film, and the nickel film may be pure nickel or a nickel alloy. The nickel alloy may contain at least one selected from among tantalum (Ta), zirconium (Zr), titanium (Ti), hafnium (Hf), tungsten (W), cobalt (Co), platinum (Pt), molybdenum (Mo), palladium (Pd), vanadium (V), and niobium (Nb).

Subsequently, a heat treatment process is performed to react silicon of the silicon capping layer 160 and the gate electrode 121 with a metal. The heat treatment process may be performed by a rapid thermal process (RPT) device or a furnace. A heat treatment temperature may be in a range of about 250° C. to about 800° C.

Through the heat treatment, silicon of the silicon capping layer 160 and the gate electrode 121 may be consumed and the silicide films 171 and 173 may be formed in the same place. Subsequently, an unreacted metal film, which has not been silicidated, is removed to thus provide the silicide films 171 and 173 on the SiGe epitaxial layer 150 and the gate electrode 121, respectively.

In order to remove the unreacted metal film, a wet etching process may be performed, and here, a mixture solution of a sulfuric acid (H$_2$SO$_4$) and hydrogen peroxide (H$_2$O$_2$) may be used to obtain high selectivity such as silicide.

When the silicide films 171 and 173 are formed, silicide films containing germanium by reacting a metal film with the SiGe epitaxial layer 150 may be formed. The Ge containing silicide films may suppress contact resistance from increasing in the source and drain regions.

Figure 12:
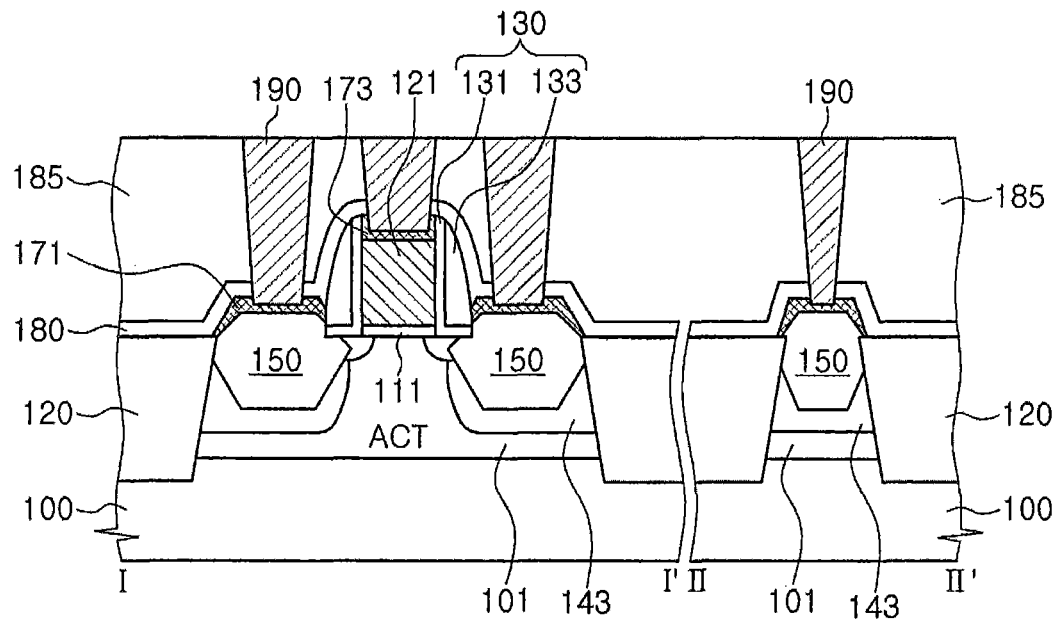

After the silicide films 171 and 173 are formed, as illustrated in FIG. 12, contact plugs 190 may be formed.

This process may start with a process of forming an interlayer dielectric 185 (or inter-layer dielectric (ILD)) on the entire upper surface of the semiconductor substrate 100. In detail, as the interlayer dielectric 185, tetra ethyl ortho silicate (TEOS), undoped silicate glass (USG), phosphosilicate glass (PSG), borosilicate glass (BSG), borophosphosilicate glass (BPSG), fluoride silicate glass (FSG), spin on glass (SOG), tonen silazene (TOSZ), or any combination thereof may be used. The interlayer dielectric 185 may be formed by using CVD, spin coating, or the like. If necessary, after the interlayer dielectric 185 is formed, a planarization process may be performed. Meanwhile, before the interlayer dielectric 185 is formed, an etch stop layer 180 may be conformally formed on the surfaces of the structures formed on the semiconductor substrate 100. For example, the etch stop layer 180 may be a silicon nitride film or a silicon oxynitride film.

Subsequently, after the interlayer dielectric 185 is formed, contact holes exposing the silicide film 171 are formed, and a conductive material may be embedded in the contact holes to form the contact plugs 190. The contact plugs 190 may be formed of a metal having low specific resistance. For example, the contact plugs 190 may be formed of at least one selected from among a metal film such as cobalt, titanium, nickel, tungsten, molybdenum, and the like, and conductive metal nitride films such as a titanium nitride film, a tantalum nitride film, a tungsten nitride film, a titanium aluminum nitride film, and the like.

Before the contact plugs 190 are formed, a metal barrier film may be formed on side walls of the contact hole to prevent diffusion of a metal element. The metal barrier film may be formed of a conducive metal nitride film such as a tungsten nitride film WN, a tantalum nitride film TiN, a titanium nitride film TaN, and the like. In the present example embodiment, it is illustrated that the contact plugs 190 are connected to the gate silicide film 173 and the source and drain silicide films 171, but connections of the contact plugs 190 may be variously modified.

In the former example embodiment, plasma pre-treatment was applied after the formation of the recesses. However, plasma pre-treatment may also be advantageously applied to an epitaxial regrowth process in order to compensate for epitaxial removed during a contact formation process. An example of a selective epitaxial regrowth process is illustrated in FIGS. 13 through 18.

FIGS. 13 through 18 may be understood as cross-sectional views of the semiconductor device illustrated in FIG. 4, taken along lines I-I' and II-II'. The process illustrated in FIG. 13 may be understood as a process that follows the process illustrated in FIG. 9.

Figure 13:
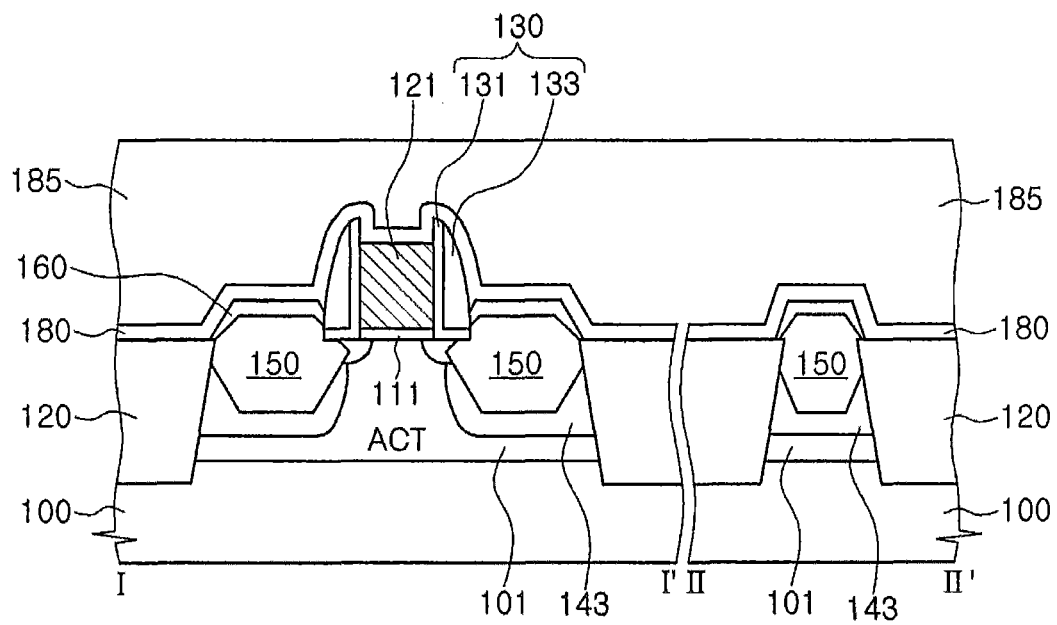
FIGS. 13 through 18 are cross-sectional views of the semiconductor device illustrated in FIG. 4, taken along lines I-I' and II-II', illustrating major processes in a method of manufacturing a semiconductor device according to further embodiments of the present inventive concepts.

As illustrated in FIG. 13, an etch stop layer 180 and an interlayer dielectric 185 may be formed on the entire upper surface of the semiconductor substrate 100 illustrated in FIG. 9.

The etch stop layer 180 may be a silicon nitride film or a silicon oxynitride film. The etch stop layer 180 may be conformally formed on the surfaces of the structures formed on the semiconductor substrate 100 by using a CVD process. Before the formation of the etch stop layer 180, the capping layer 123 on the gate electrode 121 may be removed. As described above, the interlayer dielectric 185 may be formed of an insulating material having excellent step coverage. For example, the interlayer dielectric 185 may be formed of O3-TEOS, USG, PSG, BSG, BPSG, FSG, SOG, TOSZ, or any combination thereof. The interlayer dielectric 185 may be formed by using CVD, spin coating, and the like. If necessary, after the interlayer dielectric 185 is formed, a planarization process may be performed.

Figure 14:
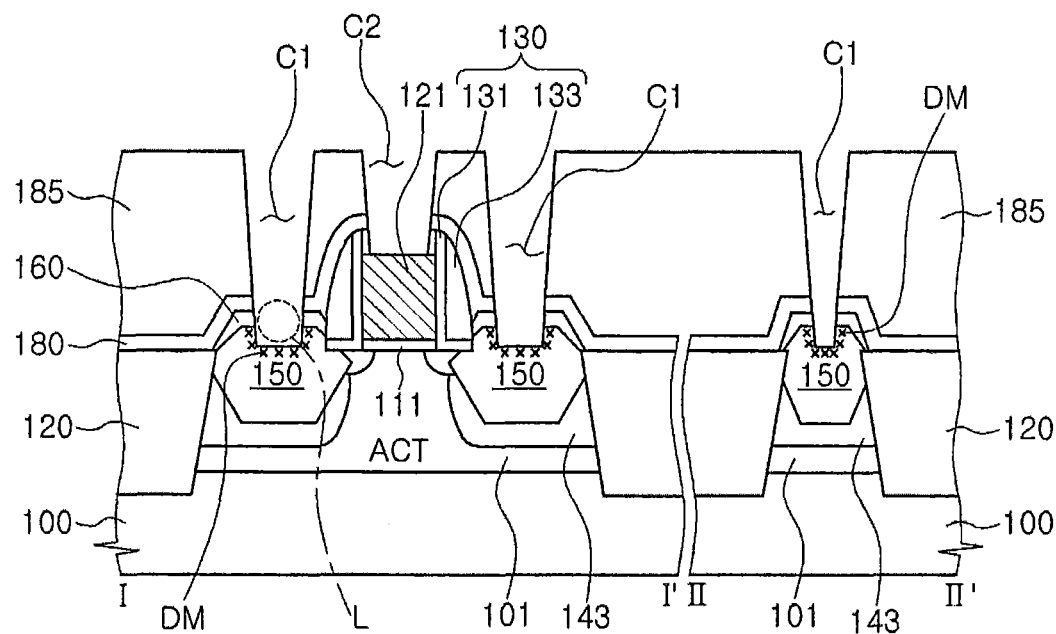

Subsequently, as illustrated in FIG. 14, contact holes C1 exposing the silicon capping layer 160 may be formed in the interlayer dielectric 185. A contact hole C2 exposing the gate electrode 121 may also be formed during the same process.

In the contact hole forming process, as illustrated in FIG. 14, a partial region of the SiGe epitaxial layer 150 may be removed. In order to sufficiently guarantee connections between the contact hole Cl and the source and drain regions, a partial region of the SiGe epitaxial layer 150 may be inevitably removed. Due to the partial removal of the SiGe epitaxial layer 150, compressive stress applied to the channel region may be reduced. In particular, since the partially removed region L is an upper region of the epitaxial layer 150 having a high concentration, the reduction in compressive stress may considerably reduce a hole mobility improvement effect.

Figure 15:
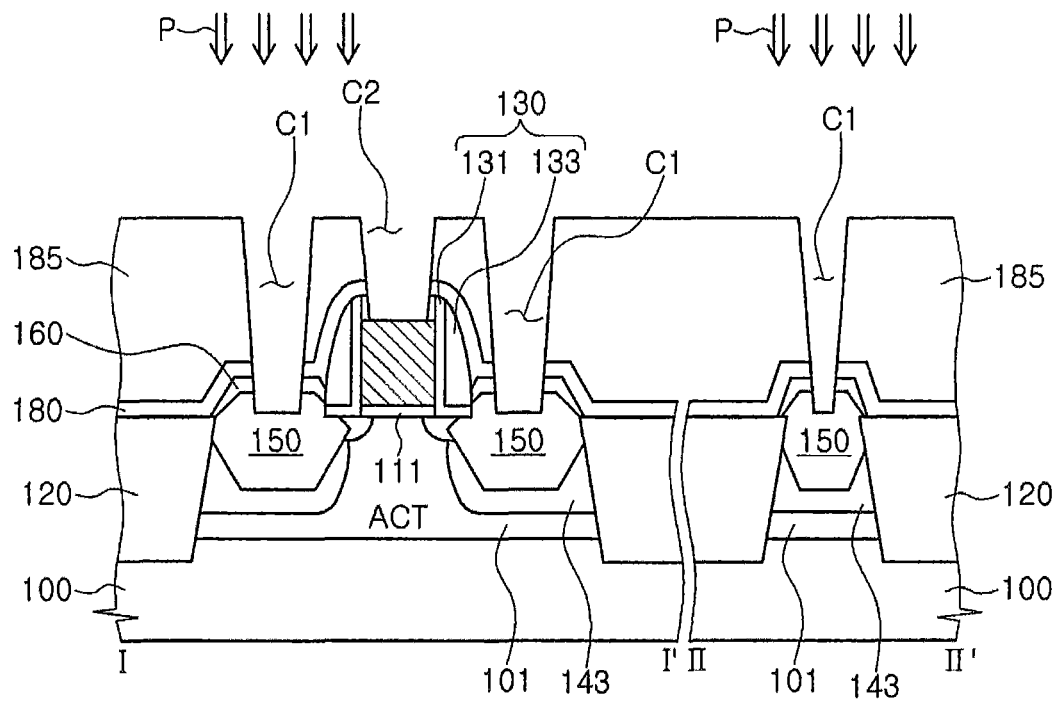

Thus, in order to compensate for the reduction in compressive stress, the SiGe epitaxial layer may need to be regrown additionally. However, since the SiGe epitaxial layer 150 has the damaged region DM exposed to the etching process during the contact hole forming process, a surface treatment process using plasma P may be performed for a selective epitaxial regrowth process as illustrated in FIG. 15. The surface treatment using plasma P may provide a high level of energy to the damaged region DM, and thus, the impurity elements, which were adsorbed onto and/or solidified in the surface and thus have not been removed during a general cleaning process, can be effectively removed and the damaged lattice may be effectively cured. The plasma source used in this process may be an inert gas such as helium (He), argon (Ar), and/or xenon (Xe). In the case of the SiGe epitaxial layer 150 like the region processed in this process, argon (Ar) or xenon (Xe) having a relatively large atom size may be effectively used. Specific process conditions appropriately selected from the condition range proposed in the former example embodiment may be used.

Figure 16:
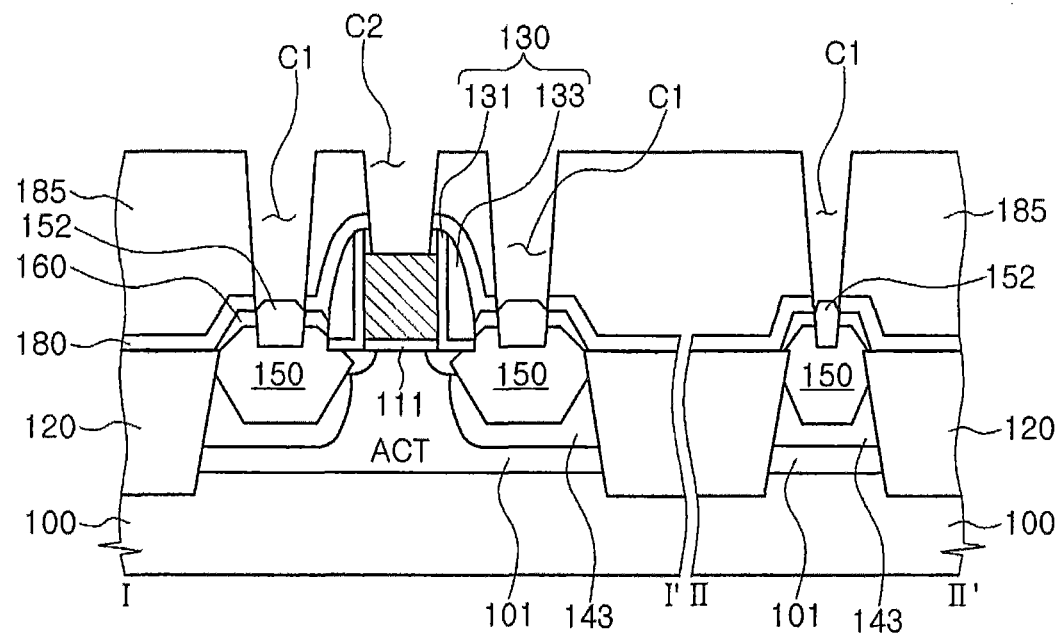

Subsequently, as illustrated in FIG. 16, an SiGe epitaxial regrowth layer 152 may be formed in the region of the SiGe epitaxial layer 150 exposed to the contact hole C1.

By using the selective epitaxial growth process, the SiGe epitaxial regrowth layer 152 may be selectively formed on the exposed region of the SiGe epitaxial layer 150, while being restrained from growing on the surface of the interlayer dielectric 185. Since the regrowth layer 152 is grown on the surface repaired by the plasma processing, high quality crystal can be obtained.

The SiGe epitaxial regrowth layer 152 may be introduced in order to compensate for compressive stress reduced due to the partial removal of the SiGe epitaxial layer 150 in the previous process. Thus, the SiGe epitaxial regrowth layer 152 may contain Ge having a high concentration. When the SiGe epitaxial layer 150 is $Si_{1-x}Ge_x$ and the SiGe epitaxial regrowth layer 152 is $Si_{1-y}Ge_y$, the content of germanium in the SiGe epitaxial regrowth layer 152, y, may be greater than the content of germanium in the SiGe epitaxial layer 150, x.

Figure 17:
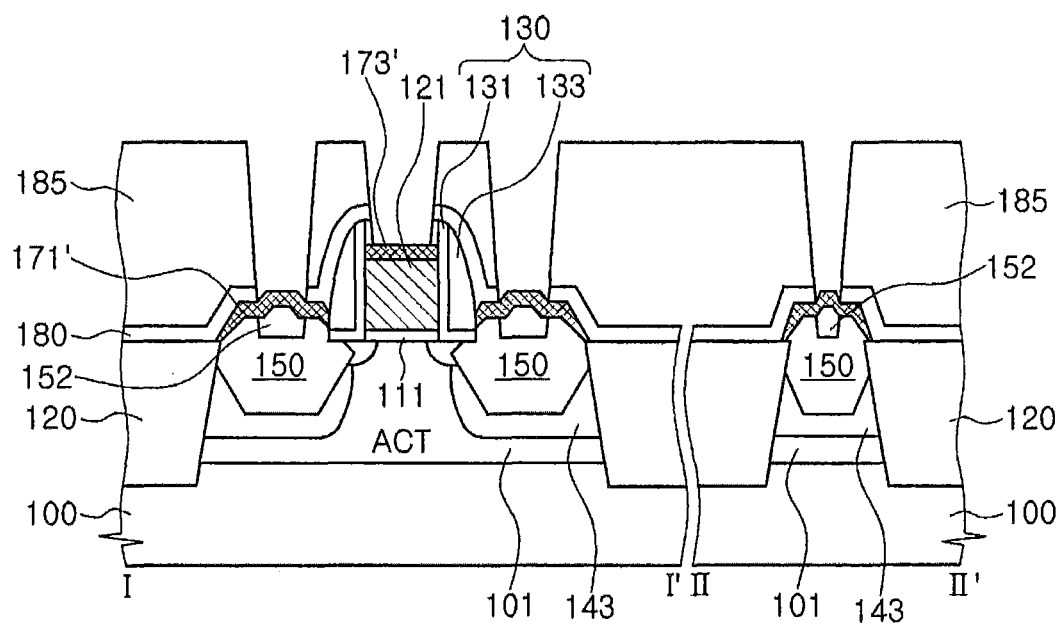

Subsequently, as illustrated in FIG. 17, silicide films 171' and 173' may be formed in the epitaxial regions exposed to the contact holes C1 and C2.

This process may be performed in a manner similar to the process described above with reference to FIGS. 11 and 12. Namely, a metal film may conformally be formed on the interlayer dielectric 185 and a heat treatment process may be performed thereon to react silicon or silicon germanium with the metal film 170 to form the silicide films 171' and 173'. Subsequently, an unreacted metal film may be removed to obtain the configuration illustrated in FIG. 17.

When the heat treatment process is performed, the silicon capping layer 160 together with a partial region of the SiGe epitaxial regrowth layer 152 may form the silicide film 171'. Of course, as in the present example embodiment, in a case in which the silicide film 171' is formed after the formation of the contact hole C1 in the interlayer dielectric 185, only an upper portion of the SiGe epitaxial regrowth layer 152 exposed to the contact hole may react with the metal to form a silicide film. Also, after the formation of the SiGe epitaxial regrowth layer 152, an additional silicon capping layer may be formed within the contact hole C1, and a silicide film may be formed by using the silicon capping layer. In this case, the formation of the silicon capping layer 160 positioned on the SiGe epitaxial layer 150 in the previous process may be omitted.

Figure 18:
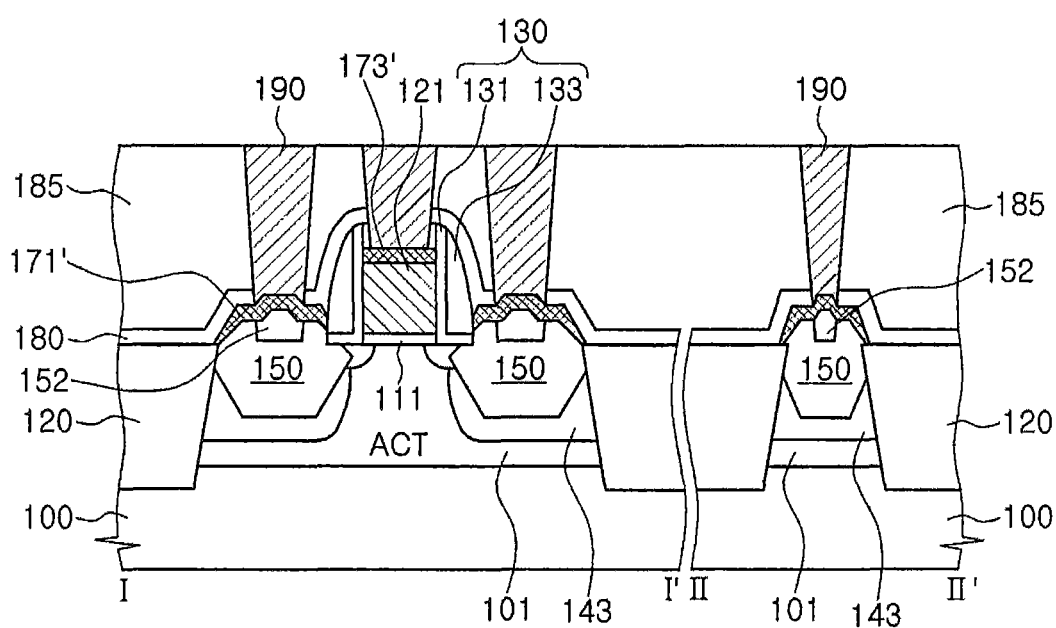

Subsequently, as illustrated in FIG. 18, a conductive material is embedded in the contact holes C1 and C2 of the interlayer dielectric 185 to form the contact plugs 190 in contact with the silicide films 171' and 173'.

Unlike the former example embodiments, the present disclosure may be applied to various FETs. In another example, the present disclosure may be advantageously applied to a FET having a fin structure.

FIGS. 19A through 33A are perspective views schematically illustrating major processes in a method of manufacturing an FET having a fin structure according to various embodiments of the present inventive concepts, and FIGS. 19B through 33B are cross-sectional views of the FET illustrated in FIGS. 19A through 33A, respectively.

Figure 19A:
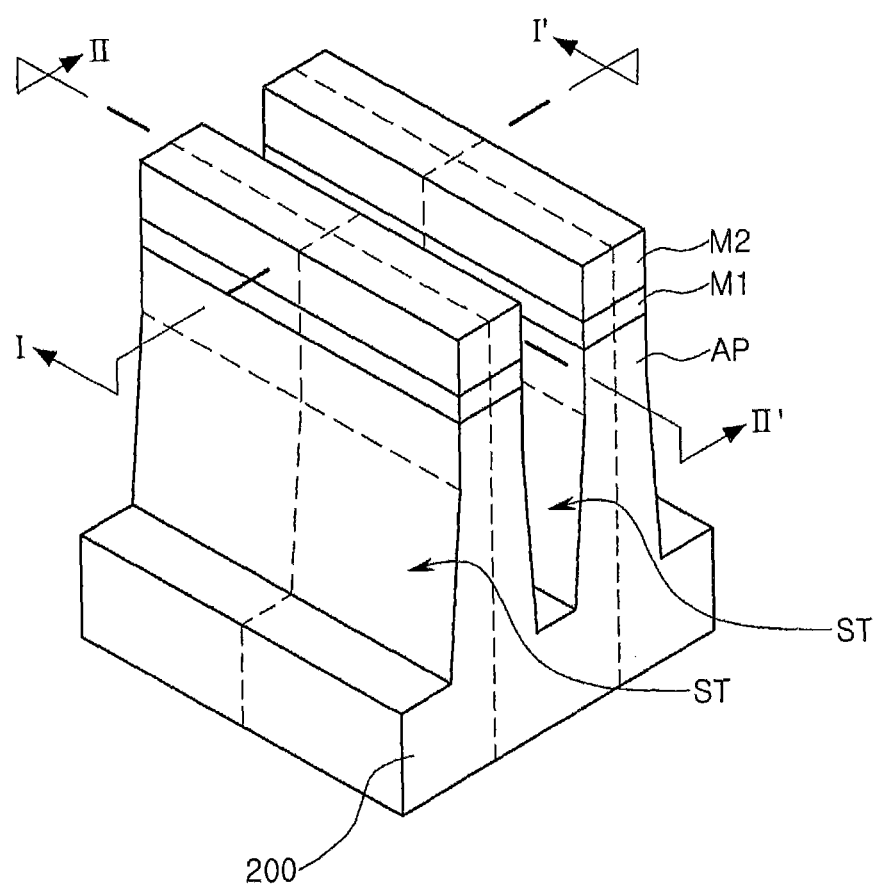
Figure 19B:
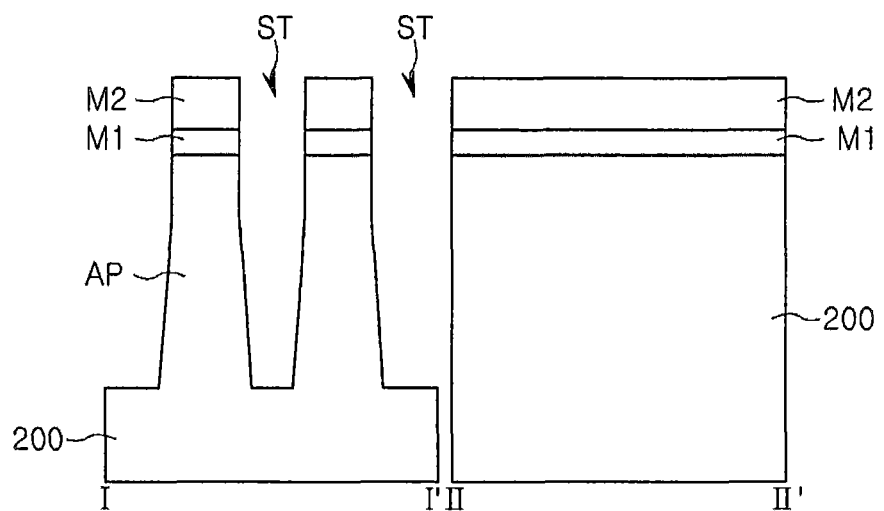

As illustrated in FIGS. 19A and 19B, a semiconductor substrate 200 may be patterned to form an isolation trenches ST defining active patterns AP.

The semiconductor substrate 200 may be a bulk silicon substrate, but the present disclosure is not limited thereto and the semiconductor substrate 200 may be a silicon germanium substrate, a germanium substrate, an SOI substrate, and the like.

The process of forming the isolation trenches ST may be performed by forming mask patterns on the semiconductor substrate 200 and subsequently performing anisotropic etching on the semiconductor substrate 200 using the mask patterns as etching masks. Here, the mask patterns may include a first mask pattern M1 and a second mask pattern M2 having etching selectivity as in the present example embodiment. During this process, the second mask pattern M2 may substantially be used as an etching mask and, after the formation of the isolation trenches ST, the second mask pattern M2 may be removed. The isolation trenches ST may be formed to have an aspect ratio equal to or greater than 5, but the present disclosure is not limited thereto. As illustrated, the isolation trenches ST are narrowed downwardly, and accordingly, the active pattern AP may have a shape narrowed upwardly.

Figure 20A:
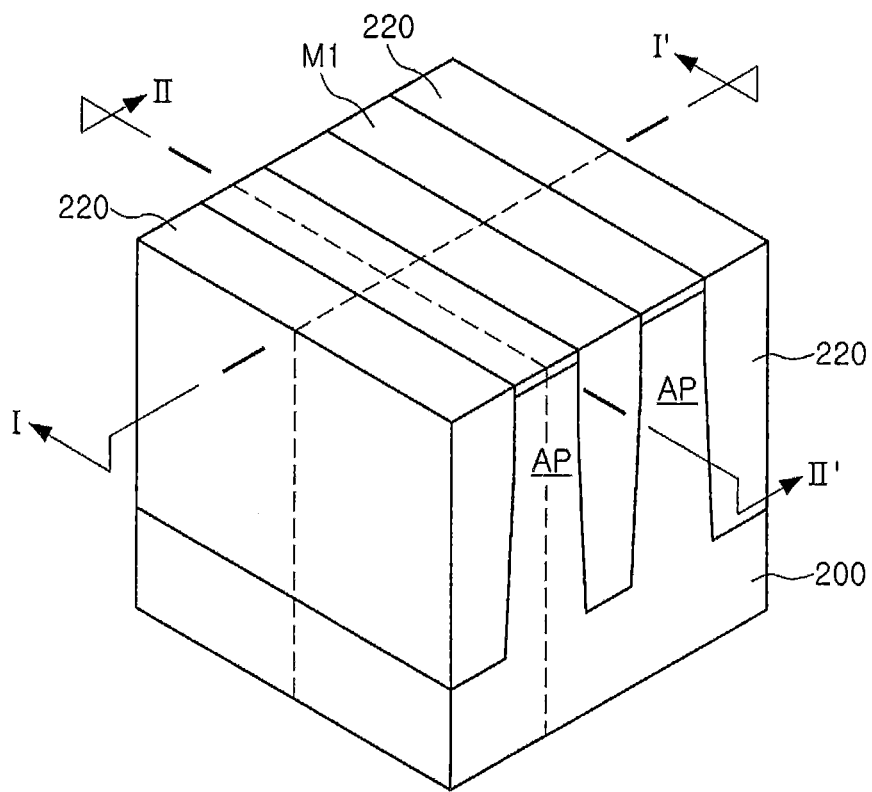
Figure 20B:
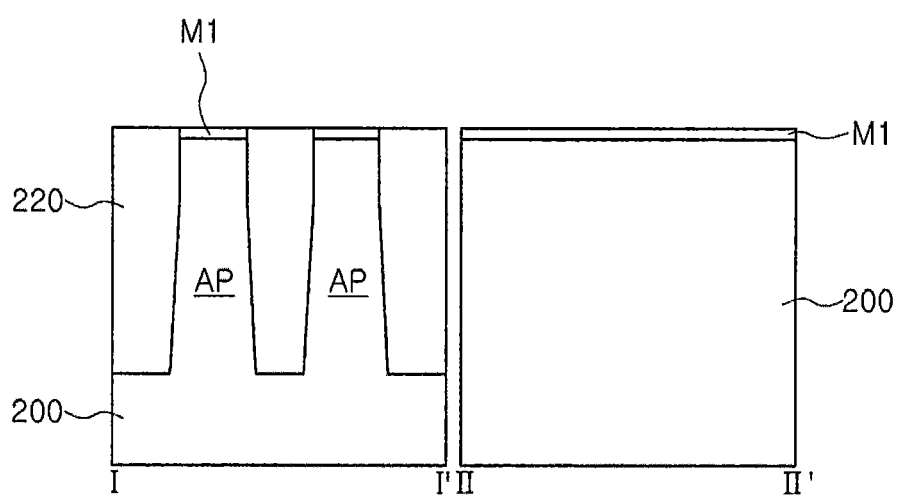

Referring to FIGS. 20A and 20B, isolation regions 220 filling the isolation trenches ST are formed. The isolation regions 220 may be formed by filling the isolation trenches ST with an insulating material and subsequently planarizing the same to expose an upper surface of the mask pattern M1.

Figure 21A:
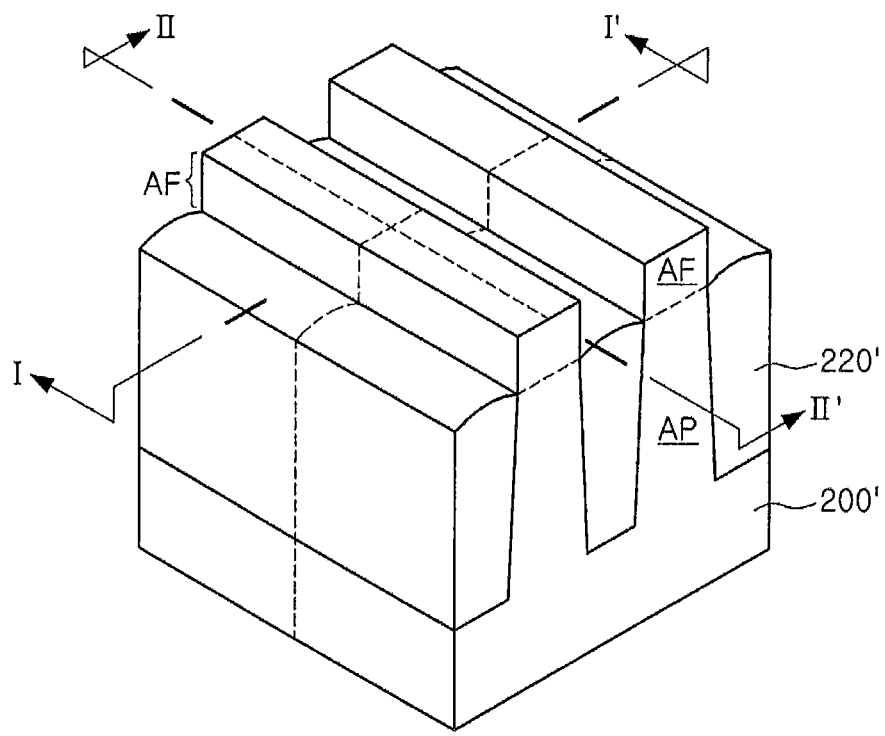
Figure 21B:
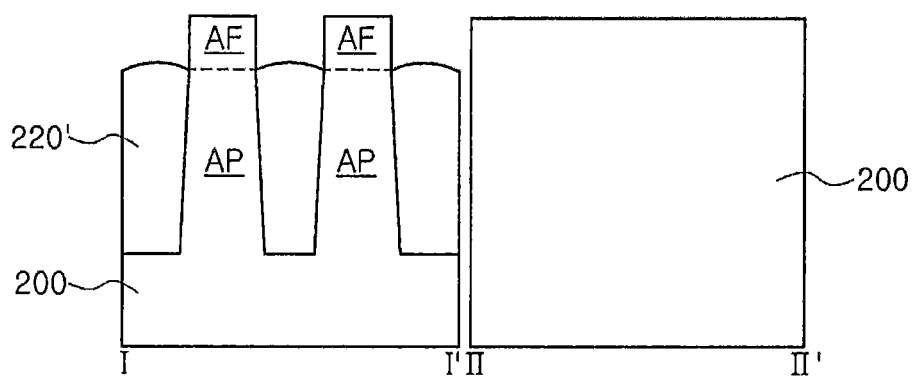

Referring to FIGS. 21A and 21B, upper regions (hereinafter, referred to as "active fins AF") are exposed.

The process of exposing the active fins AF may be performed by a wet etching process using the first mask pattern M1 as an etching mask. Through the wet etching process, isolation regions 220' may have a shape in which upper regions thereof have been partially removed. As a result, partial regions of the active patterns AP may be exposed to be provided as active fins AF. While the isolation regions 220 are being etched to a desired depth by adopting an appropriate etching condition, the first mask pattern M1 may be removed and the upper surfaces of the active fins AF may be exposed.

Figure 22A:
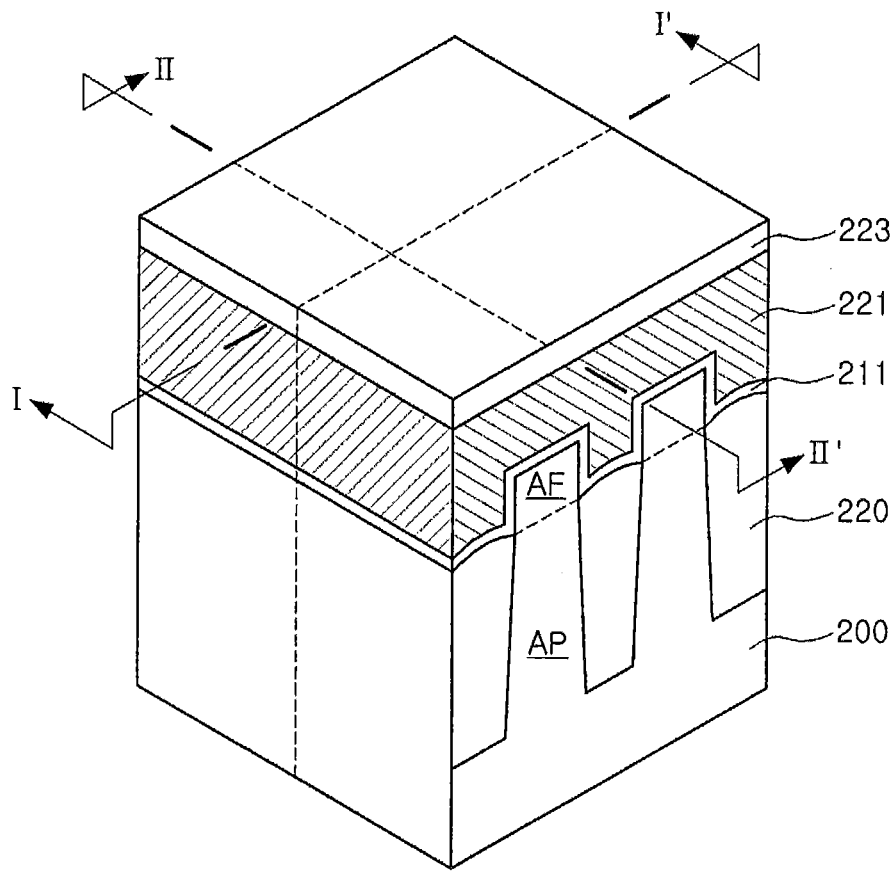
Figure 22B:
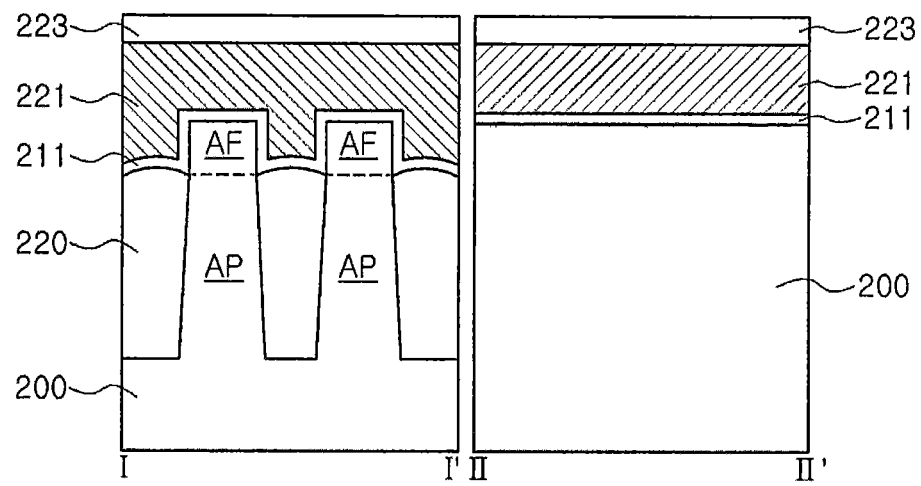

Referring to FIGS. 22A and 22B, a gate insulating layer 211 covering the active fins AF is formed, and a gate electrode 221 and a capping film 223 are formed thereon.

The gate insulating layer 211, the gate electrode 221, and the capping film 223 formed during this process may be formed of a material similar to that described above with reference to FIG. 5, unless otherwise mentioned. In a specific example, the gate insulating layer 211 may be formed through atom layer deposition (ALD) and subsequently heat-treated. However, the heat treatment may be applied after the deposition process such as ALD, or alternatively, the heat treatment may be performed in a follow-up heat treatment process (e.g., formation of silicide).

Figure 23A:
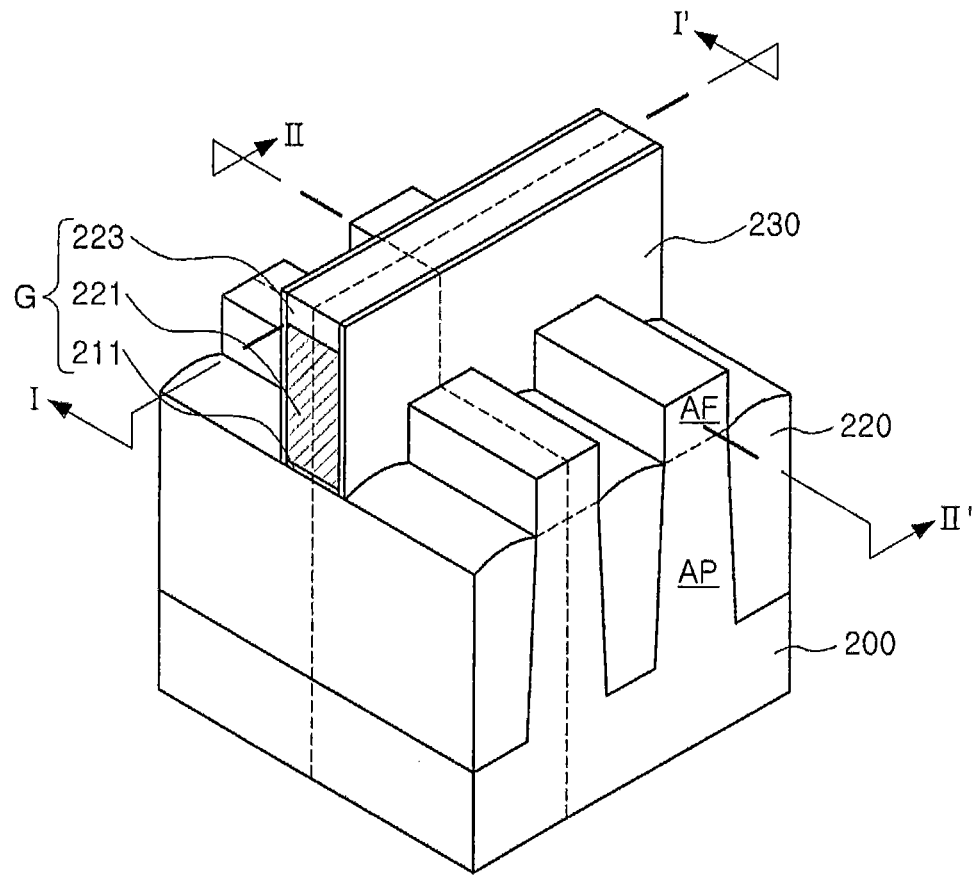
Figure 23B:
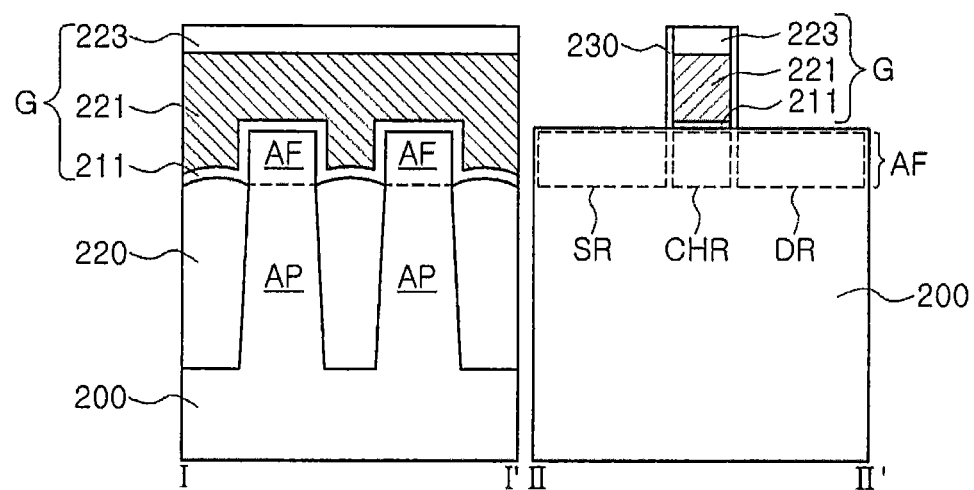

Referring to FIGS. 23A and 23B, the gate insulating layer 211, the gate electrode 221, and the capping film 223 are patterned to form a gate electrode structure G, and spacers 230 may be formed on both sides of the resultant gate electrode structure G Here, patterning may be formed such that the gate electrode structure G is formed to transverse the active fins AF. Thus, as illustrated in FIG. 23B, a channel region CHR and source and drain regions SR and DR may be defined in the active fins AF. In detail, the channel region CHR is a region of the active fin AF positioned below the gate electrode structure G, and the source and drain regions SR and DR may be defined as other regions of the active fins AF positioned on both sides of the gate electrode structure G and horizontally divided by the channel region CHR.

The process of forming the gate electrode structure G may be performed as a process of exposing partial regions (namely, the source and drain regions SR and DR) of the active fins AF positioned on both sides of the gate electrode structure G In a specific example, the gate electrode 221 and the capping film 223 are anisotropic-etched using the gate insulating layer 211 as an etch stop layer, and an anisotropic etching process may be performed on the exposed portion of the gate insulating layer 211 to expose the source and drain regions SR and DR.

The spacers 230 may be formed on both side walls of the gate electrode structure G The process of forming the gate electrode structure G may be performed by forming films for the spaces on the gate electrode structure G and subsequently anisotropically-etching the films.

Figure 24A:
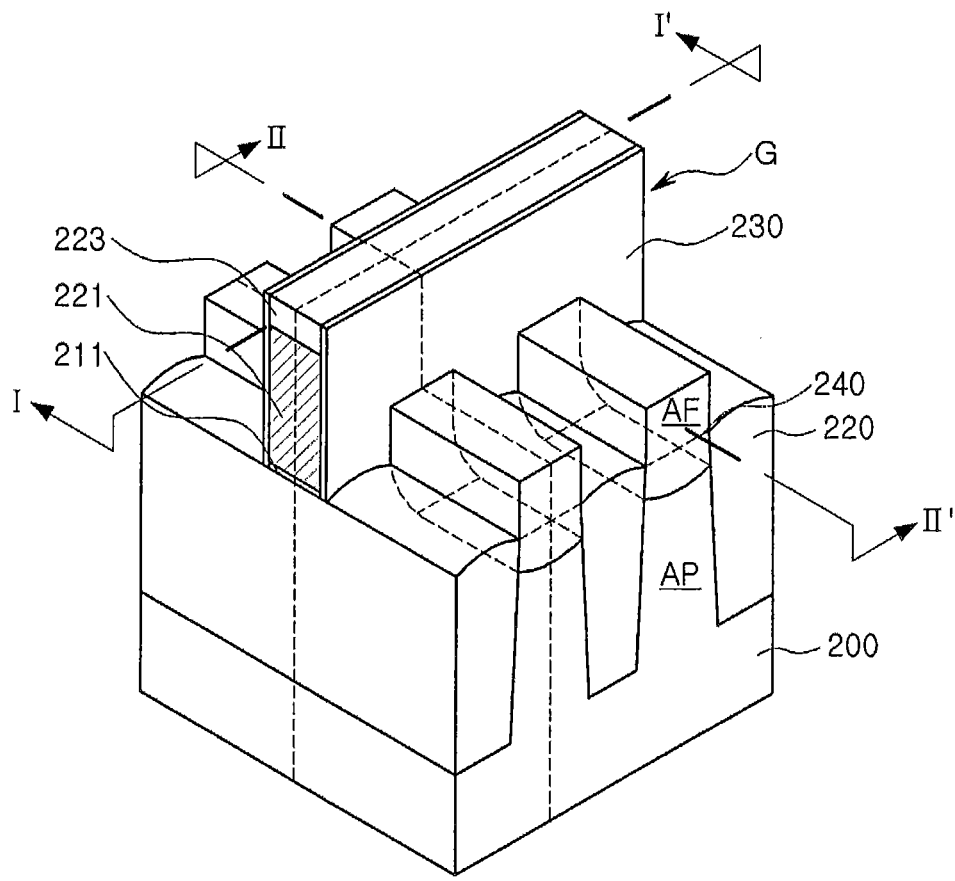
Figure 24B:
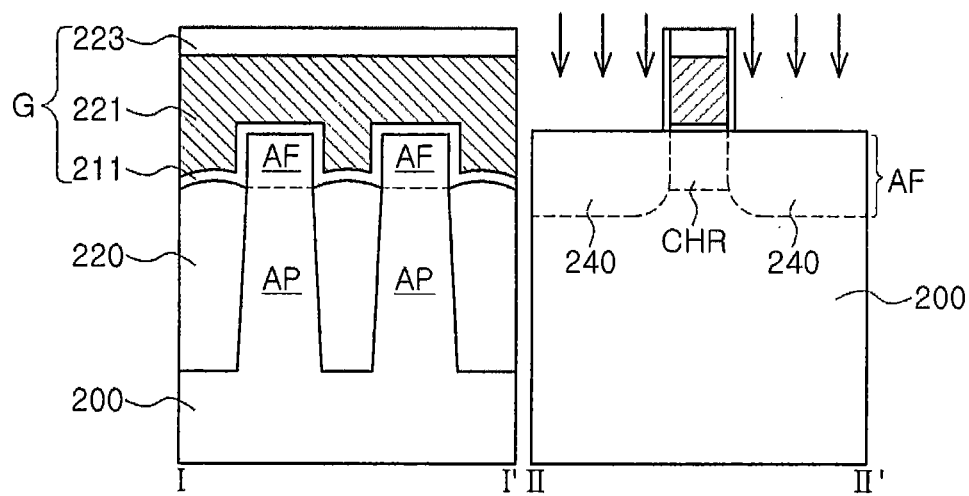

Referring to FIGS. 24A and 24B, after the spacers 230 are formed, impurity regions 240 may be formed in the regions of the active fins AF on both sides of the gate electrode structure G, namely, in the source region SR and the drain region DR. The impurity regions 240 may be formed by implanting a p-type impurity, e.g., boron (B), by using the gate electrode structure G having the spacers 230 as an ion implantation mask.

Figure 25A:
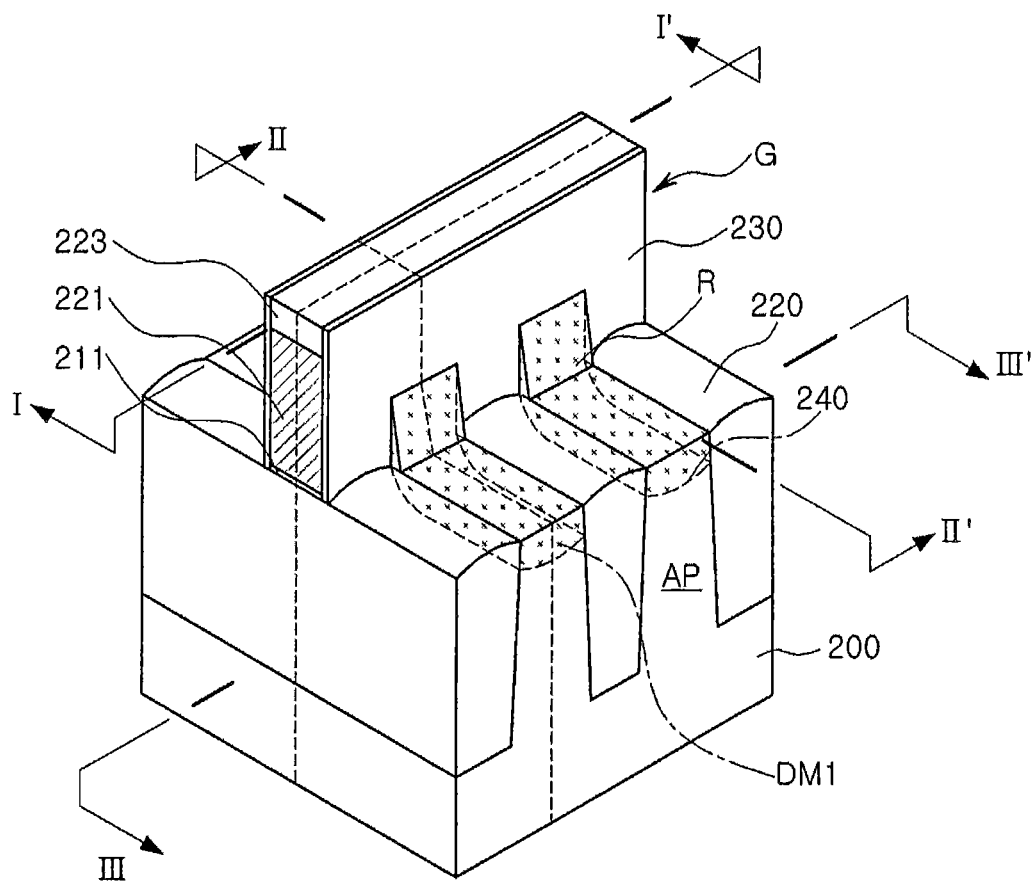
Figure 25B:
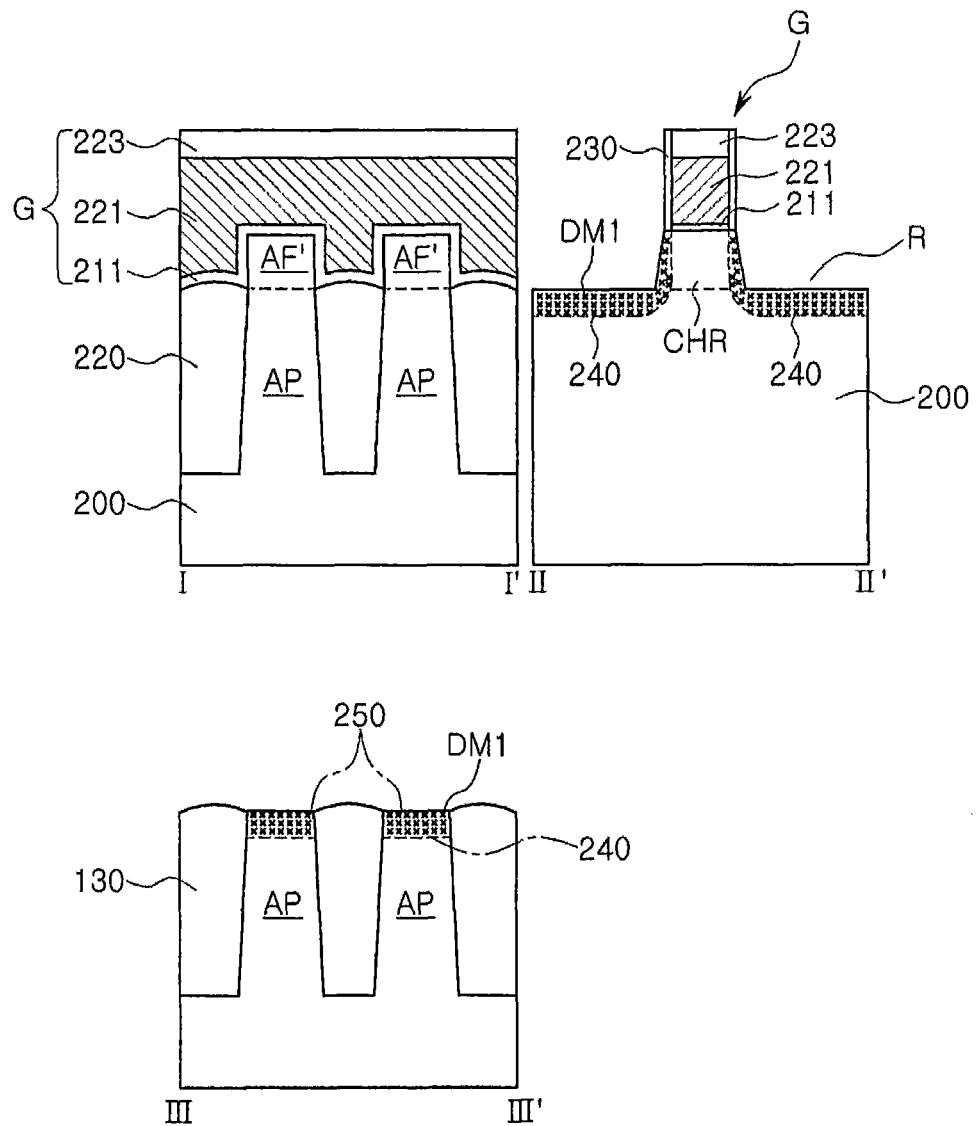

Thereafter, as illustrated in FIGS. 25A and 25B, the active fin AF regions on both sides of the gate electrode structure G may be selectively etched to form recesses R.

The recesses R may be formed by performing anisotropic-etching and/or isotropic-etching using the gate electrode structure G as an etching mask. In the present example embodiment, the recesses R may be provided on both sides of the gate electrode structure G In a specific example, an isotropic or anisotropic dry etching process may be performed on the source and drain regions SR and DR of the active fins AF using the isolation regions 220 together with the gate electrode structure G as etching masks to form trenches having a depth lower than desired recesses. Subsequently, an etching solution may be supplied to the trenches to perform an isotropic etching process thereon to provide the bottom surfaces and lateral surfaces of the recesses R as specific crystal planes.

Due to the etching process, surfaces of the recesses R and internal regions thereof adjacent to the surfaces of the recesses R may be contaminated and the crystal may be damaged. The surface regions DM1 contaminated and damaged by the etching process may be subject to a cleaning process after the recess R formation process is completed. Here, however, it may be difficult to expect to remove adsorbed/solidified impurity elements and cure the damaged lattice through a general cleaning process. Thus, in order to solve the problem, the pre-treatment using plasma illustrated in FIG. 8 is required.

Figure 26A:
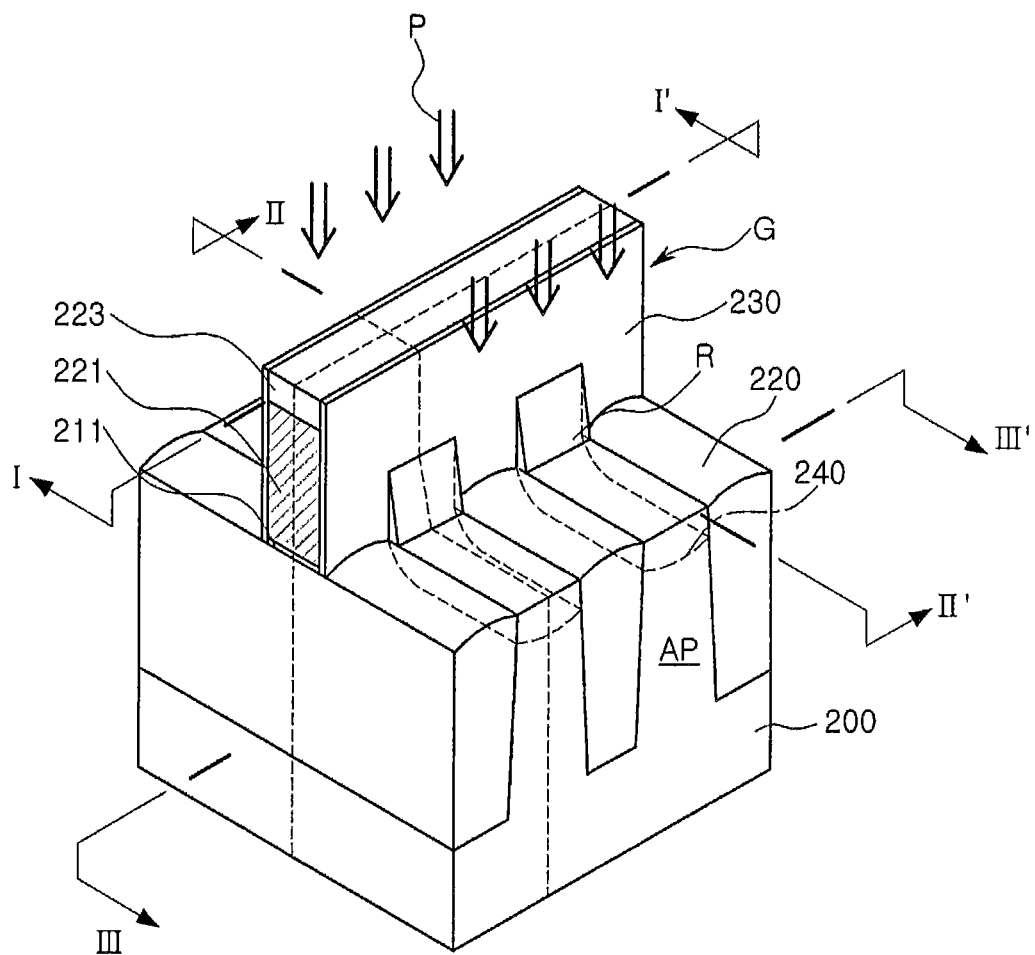
Figure 26B:
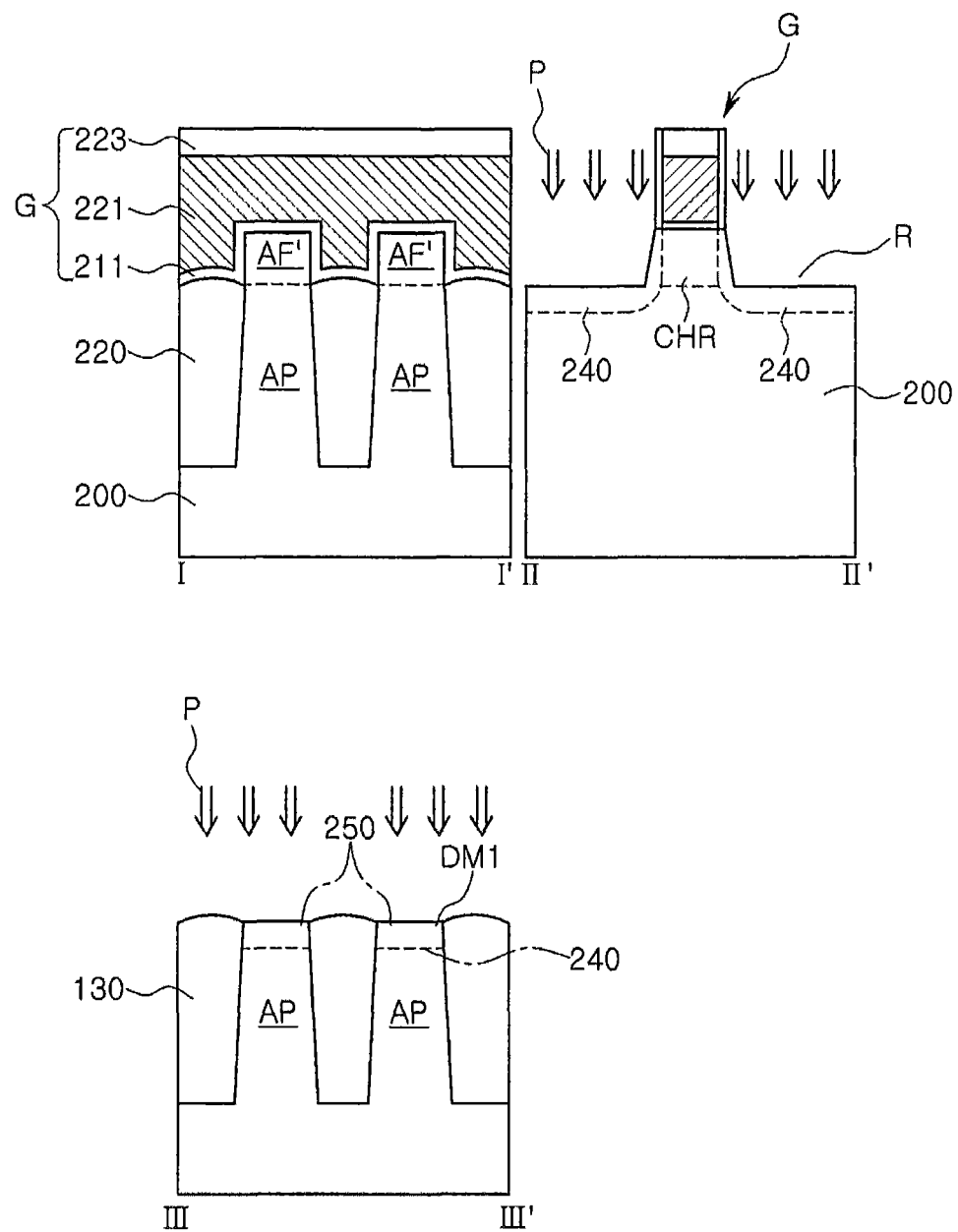

Subsequently, as illustrated in FIGS. 26A and 26B, a pre-treatment using inert gas plasma P may be performed on the recesses R.

Through the inert gas plasma processing, the impurity elements adsorbed onto and/or solidified in the damaged regions DM1 may be effectively removed and the damaged lattice may be effectively cured. A plasma source used in this process may be an inert gas such as helium (He), argon (Ar), and/or xenon (Xe). In a specific example, more effective curing may be expected by using a plasma source such as argon (Ar) or xenon (Xe).

In detail, in the case of inert gas plasma, plasma to be used for a pre-treatment may be generated by applying power in a range of 800 kW to 4000 kW. Processing using plasma may be performed at relatively low temperatures (e.g., 600° C. or lower). For example, processing using plasma may be performed at 500° C. or lower. A pre-treatment using plasma may be performed at pressure in a range of 0.1 torr to 10 torr and the pre-treatment may be performed for a period of time in a range of 10 seconds to 300 seconds, but the present disclosure is not limited thereto.

Figure 27A:
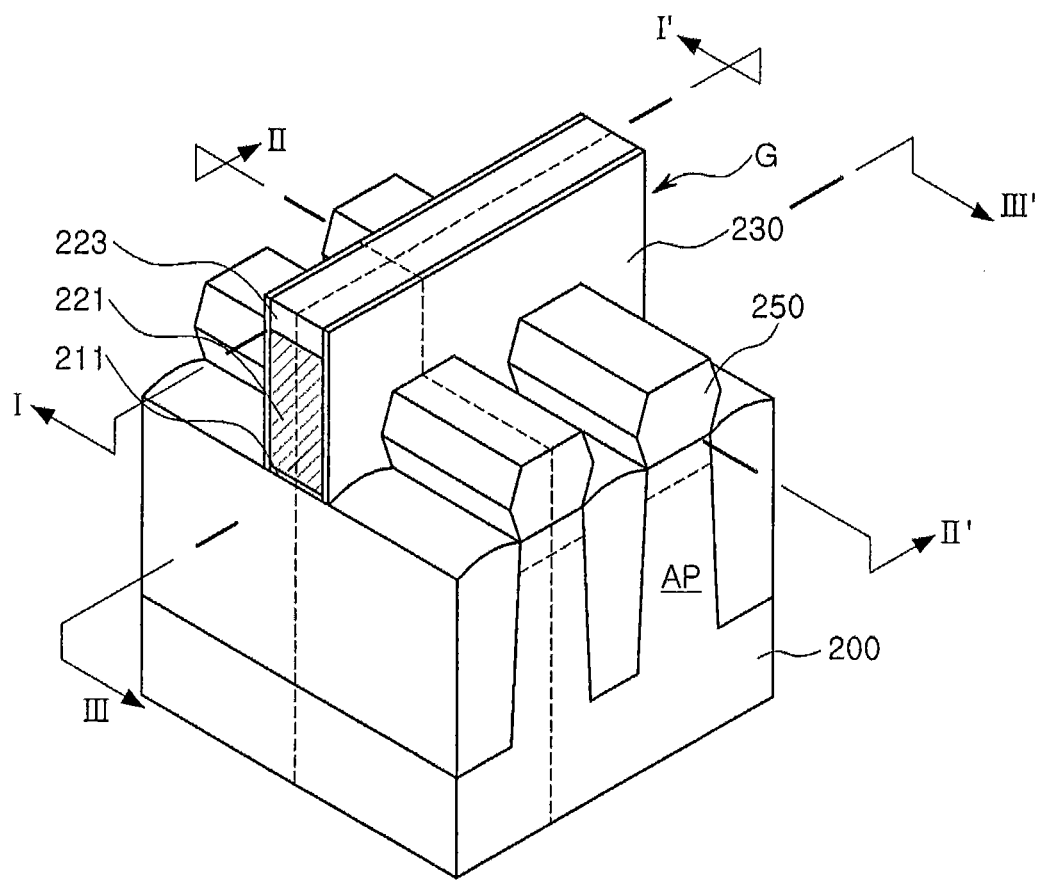
Figure 27B:
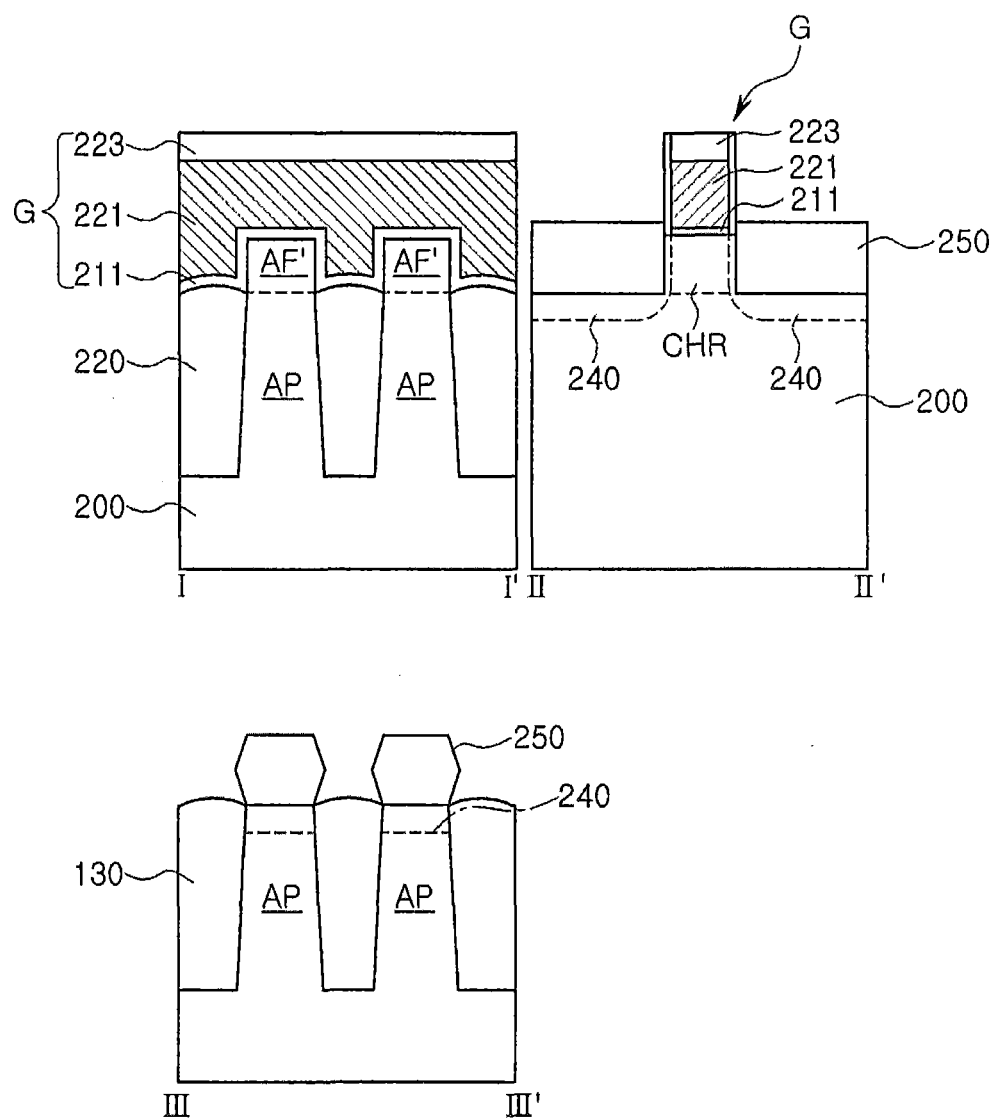

Subsequently, as illustrated in FIGS. 27A and 27B, a selective epitaxial growth (SEG) process may be performed to form a first SiGe epitaxial layer 250 in the recesses R.

The first SiGe epitaxial layer 250 may be selectively grown only in the region exposed to the recesses R through the SEG process. Since the recesses R have surfaces advantageous for crystal growth by the previous pre-treatment using plasma, an epitaxial layer having desired quality may be grown during this growth process. The SiGe epitaxial formation process (described above with reference to FIG. 9) of the former example embodiment may be combined here for reference, unless otherwise mentioned.

In case of the PMOS transistor as in the present example embodiment, when the first SiGe epitaxial layer 250 is grown in the recesses R, compressive stress may be generated in the channel region. Since the lattice of the first SiGe epitaxial layer 250 is increased as the concentration of Ge is increased, compressive stress applied to the channel region may be increased.

In the present example embodiment, a concentration of Ge may be greater in an upper region of the first SiGe epitaxial layer 250 than in a lower region thereof. For example, the lower region of the first SiGe epitaxial layer 250 may have a thickness in a range of about 20 nm to about 50 nm, and a Ge concentration of the lower region may be in a range of 10% to 30%. The upper region of the first SiGe epitaxial layer 250 may have a thickness in a range of about 40 nm to about 60 nm, and a Ge concentration of the upper region may be in a range of 20% to 50%.

The first SiGe epitaxial layer 250 may be an epitaxial layer doped with a p-type impurity. In the present example embodiment, doping the first SiGe epitaxial layer 250 with an impurity may be performed by doping a p-type impurity in-situ during the epitaxial growth process, or may be performed by ion-implanting a p-type impurity after the selective epitaxial growth. The first SiGe epitaxial layer 250 doped with a p-type impurity may be provided as source and drain regions together with the impurity regions 240.

Figure 28A:
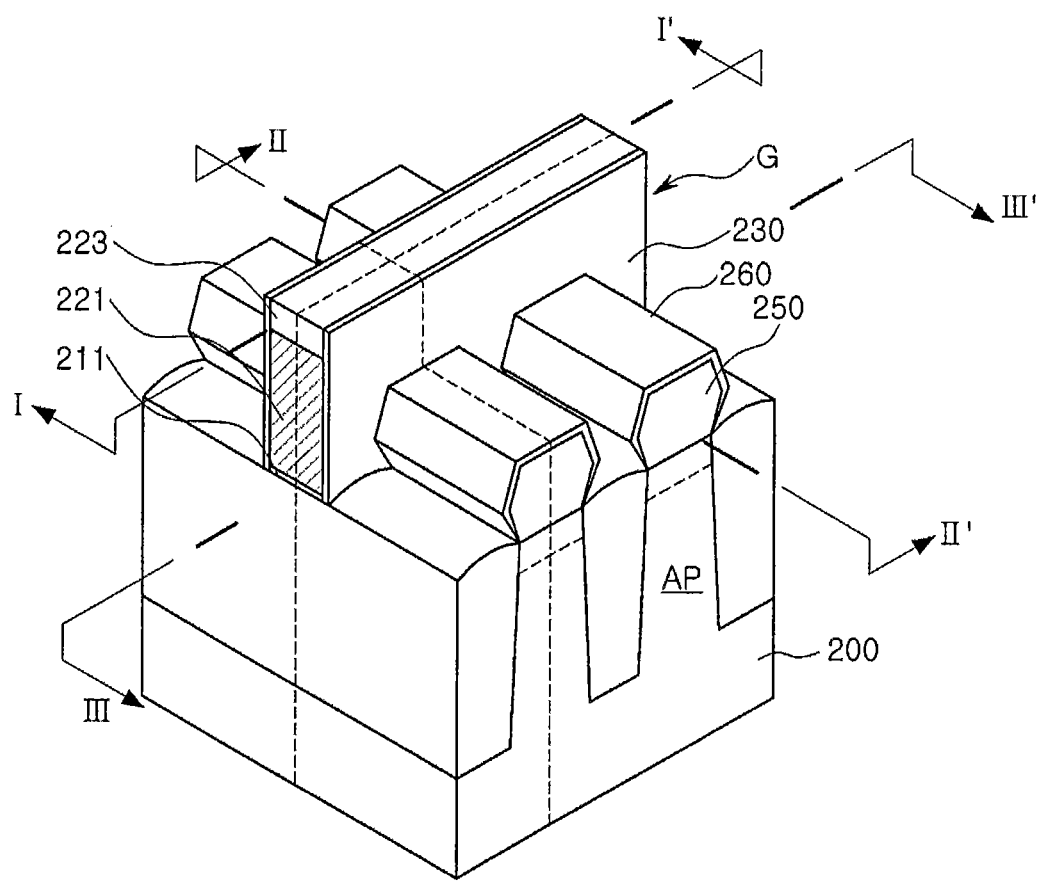
Figure 28B:
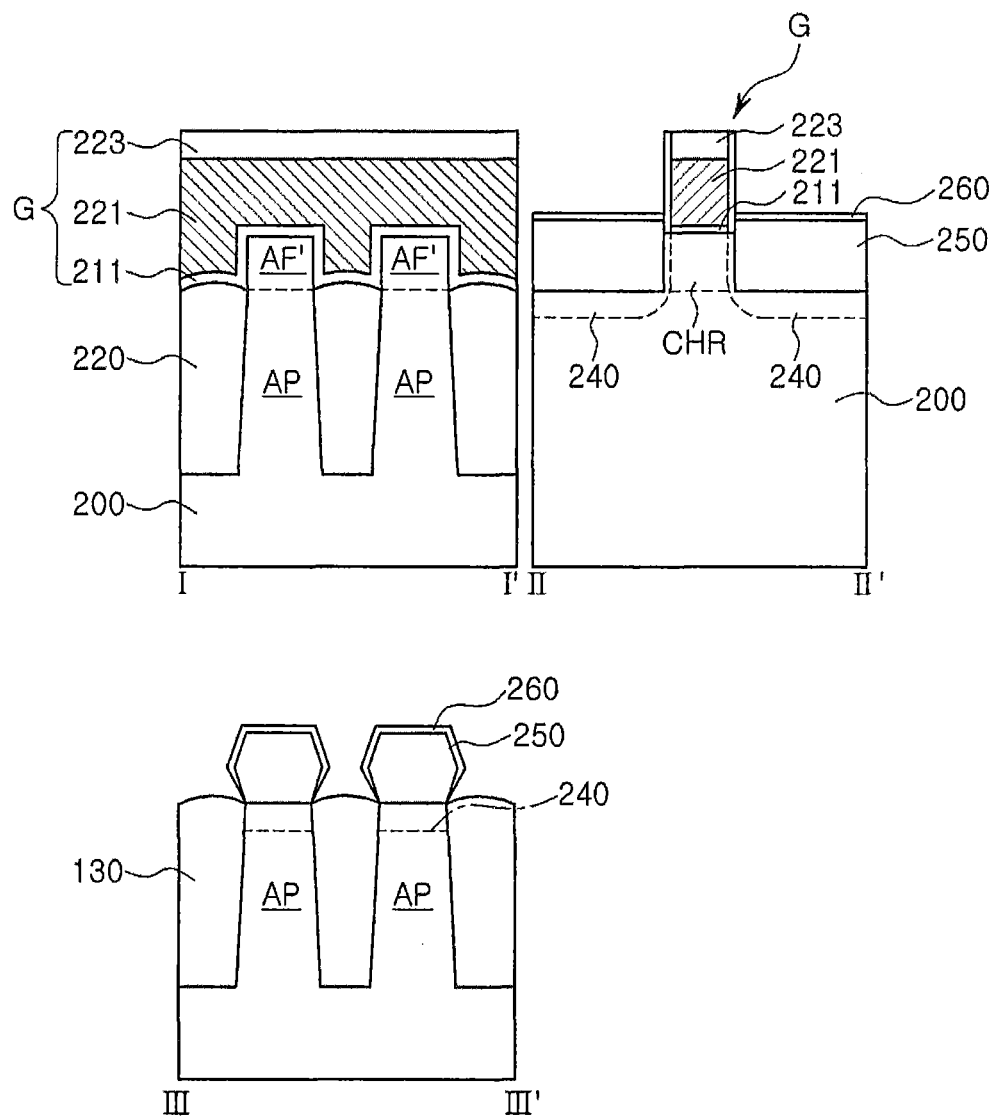

Thereafter, as illustrated in FIGS. 28A and 28B, a silicon capping layer 260 may be formed on the first SiGe epitaxial layer 250. The silicon capping layer 260 may cover the surface of the first SiGe epitaxial layer 250. The thickness of the silicon capping layer 260 may differ according to crystal planes of the first SiGe epitaxial layer 250. The silicon capping layer 260 may be used to form a silicide film in a follow-up process.

Figure 29A:
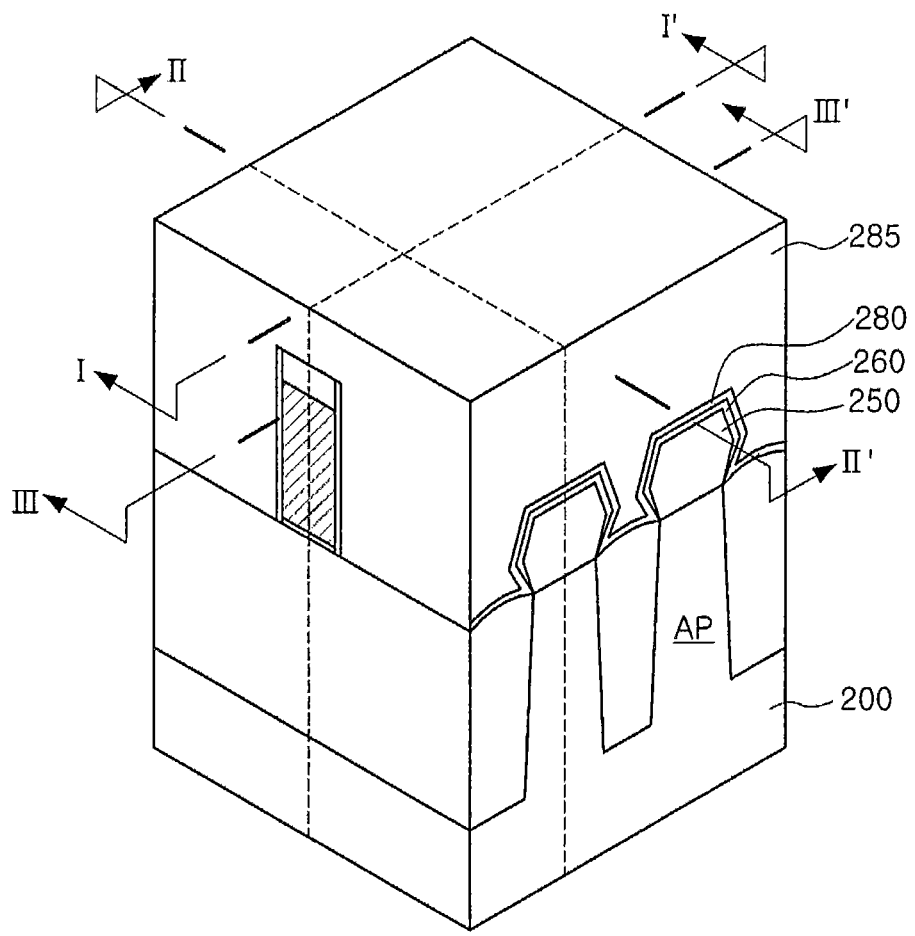
Figure 29B:
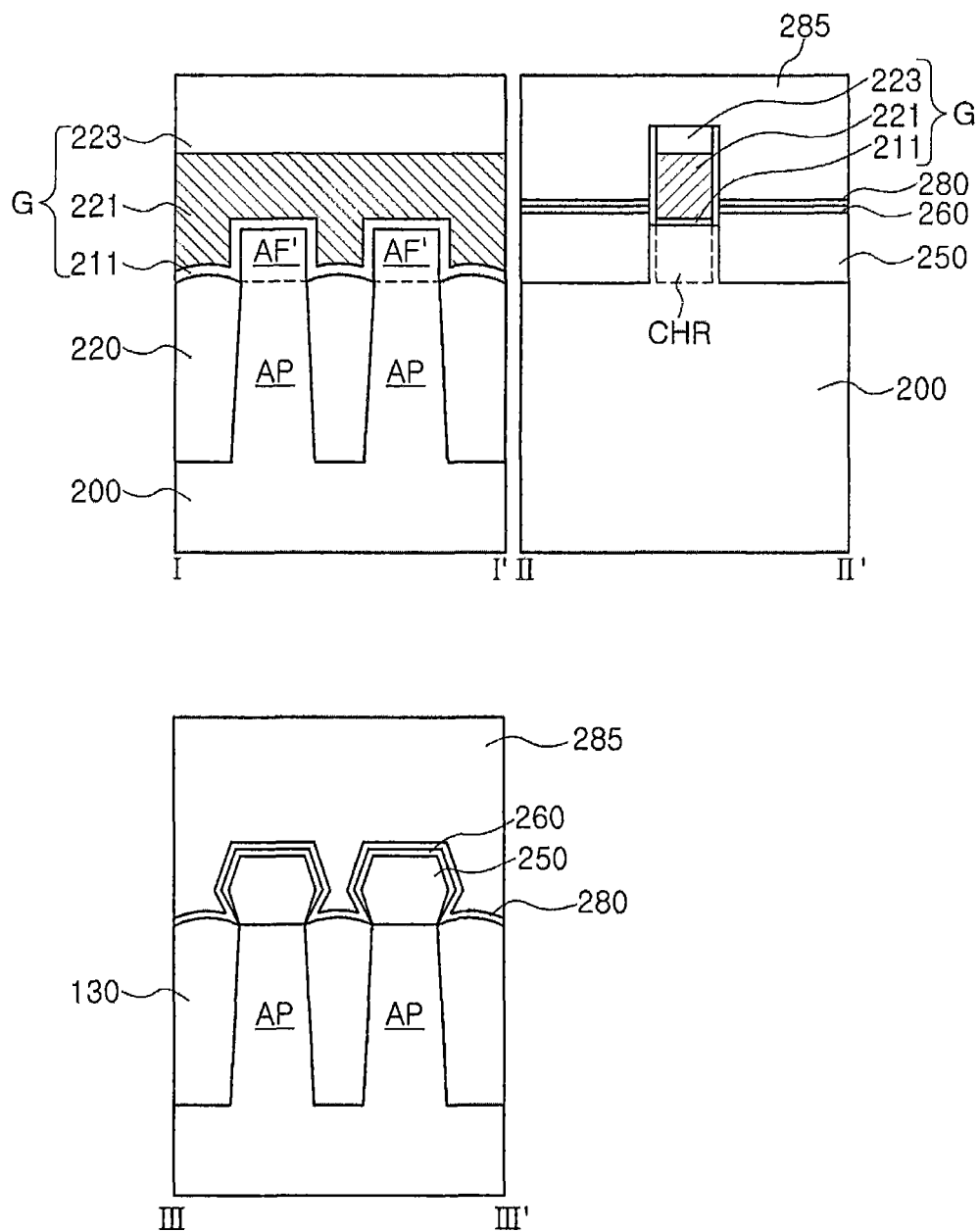

Subsequently, as illustrated in FIGS. 29A and 29B, an etch stop layer 280 and an interlayer dielectric 285 may be formed on the entire surface of the semiconductor substrate 200.

The etch stop layer 280 may be a silicon nitride film or a silicon oxynitride film. The etch stop layer 280 may be conformally formed on the surfaces of the structures formed on the semiconductor substrate 200. Before the formation of the etch stop layer 280, the capping layer 233 on the gate electrode 221 may be removed.

The interlayer dielectric 285 may be formed of an insulating material having excellent step coverage. If necessary, after the interlayer dielectric 285 is formed, a planarization process may be performed.

Figure 30A:
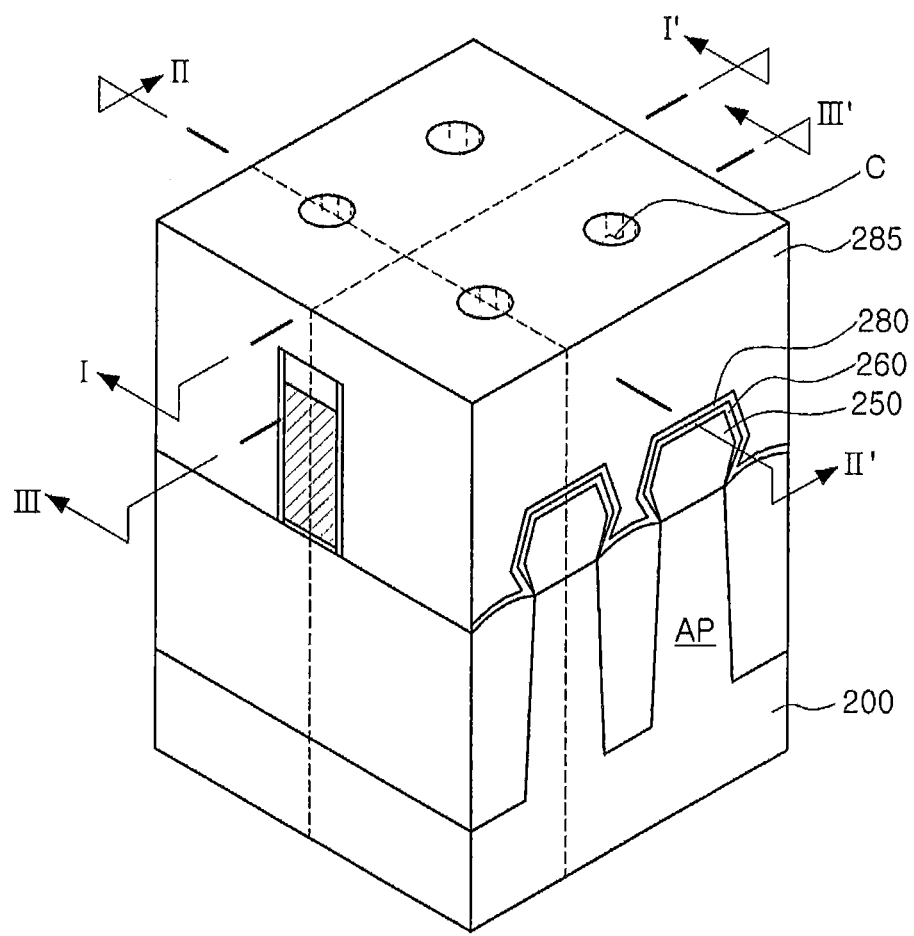
Figure 30B:
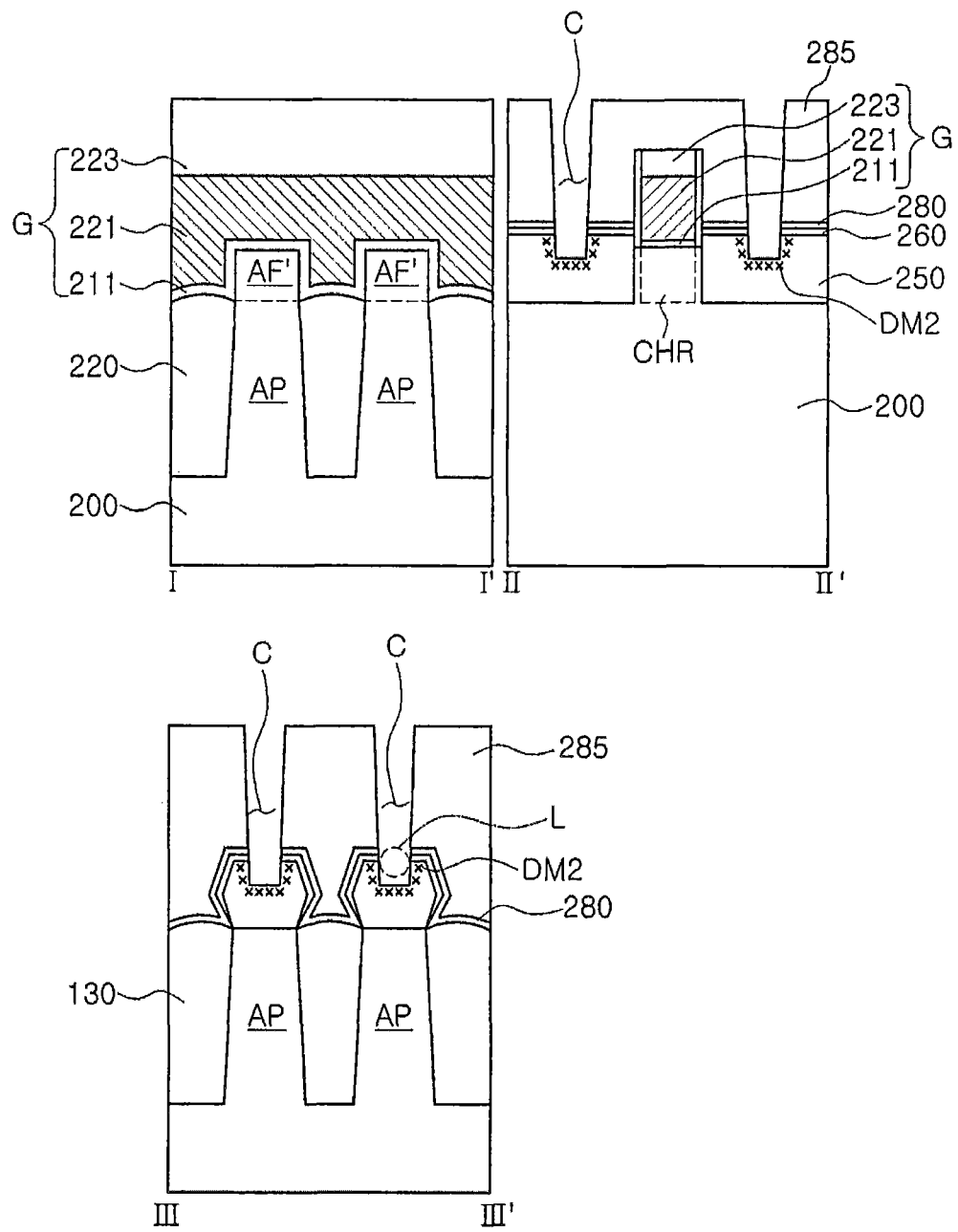

Thereafter, as illustrated in FIGS. 30A and 30B, contact holes C exposing the silicon capping layer 260 may be formed in the interlayer dielectric 285.

In the contact hole forming process, a partial region of the first SiGe epitaxial layer 250 may be removed. Here, since the partially removed region L is an upper region of the first SiGe epitaxial layer 250 having a high concentration, a reduction in compressive stress may considerably reduce a hole mobility improvement effect.

Figure 31A:
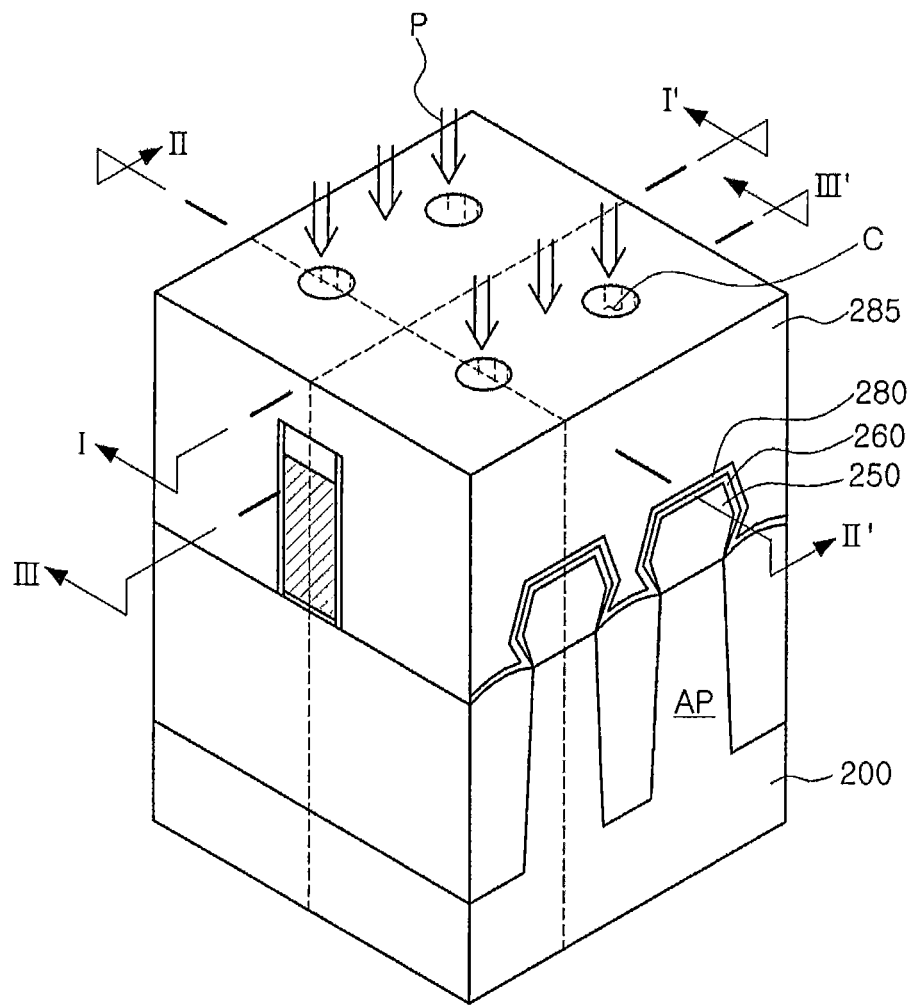
Figure 31B:
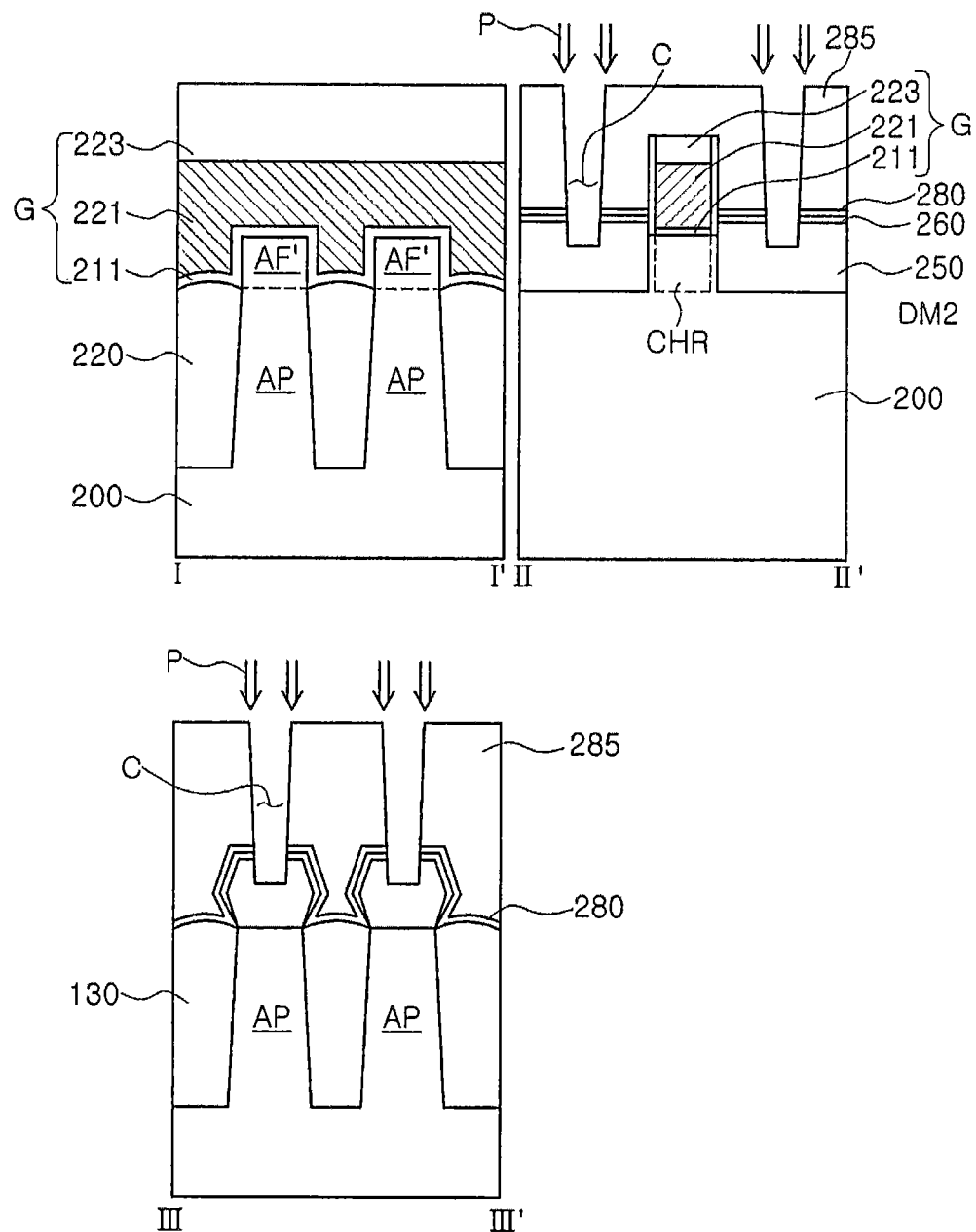
Figure 32A:
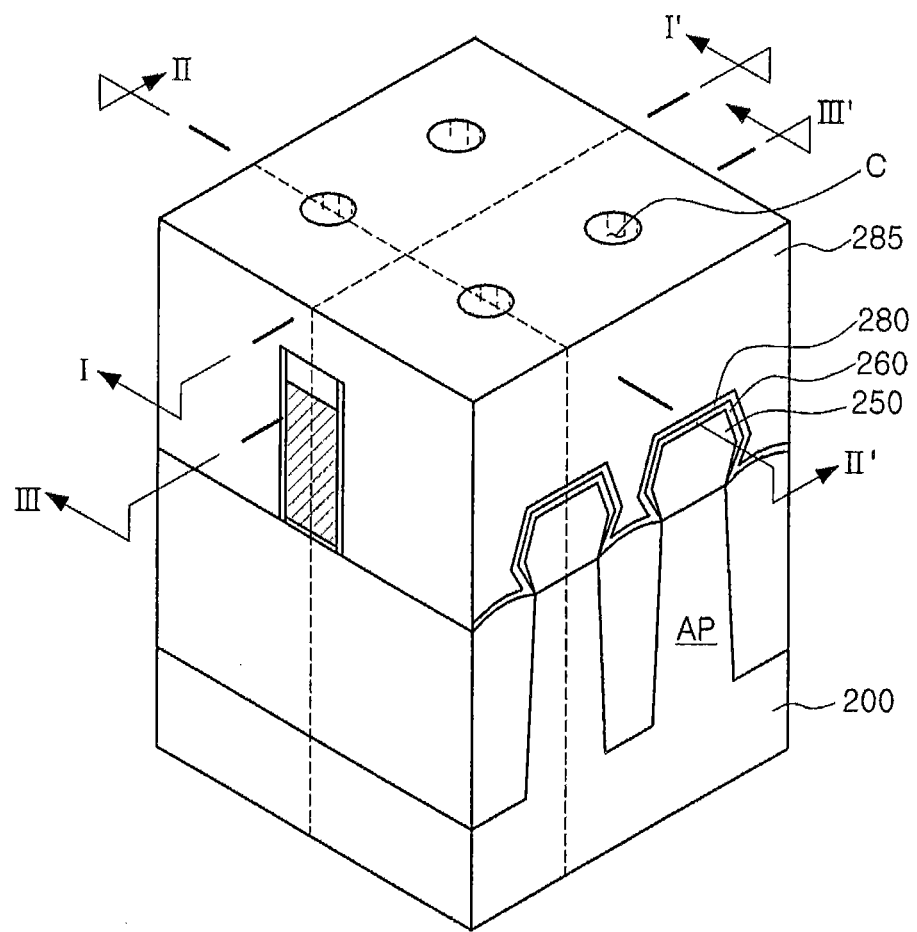
Figure 32B:
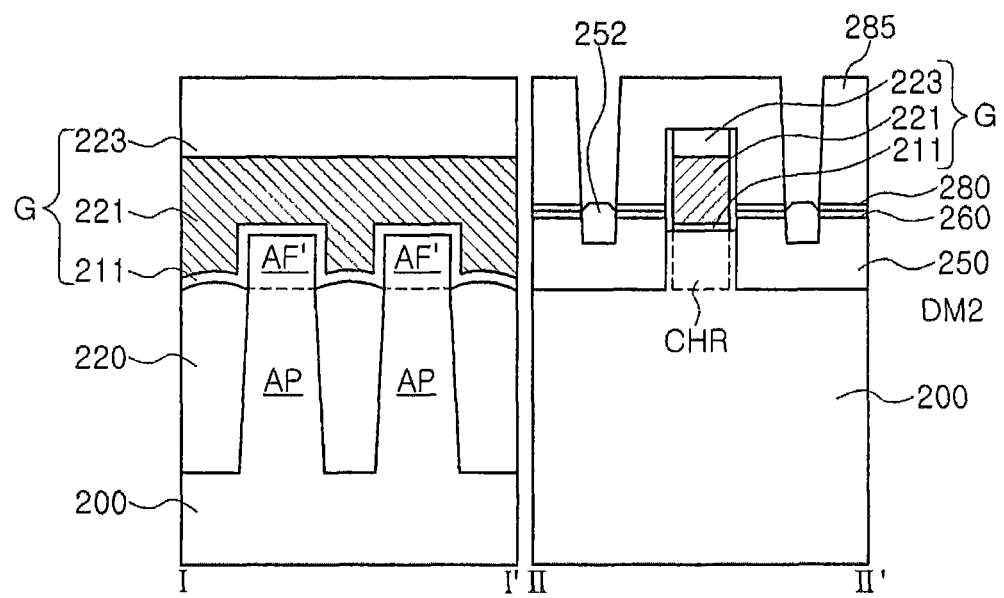
Figure 32B:
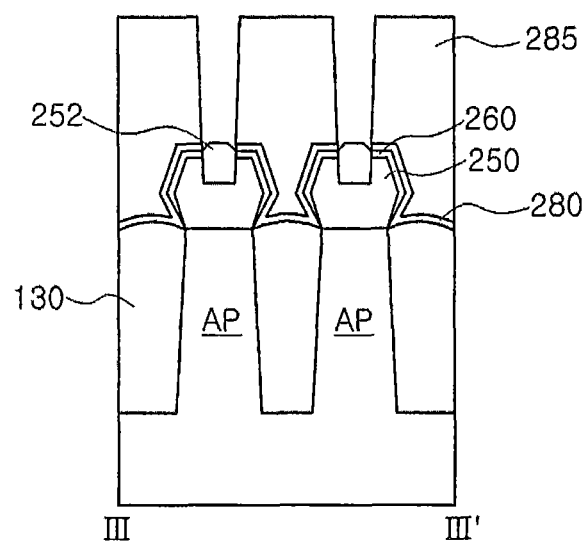

Thus, in order to compensate for the reduction in compressive stress, a selective epitaxial growth process may be additionally applied. Beforehand, as illustrated in FIGS. 31A and 31B, a surface treatment process using plasma P may be performed on the region DM2 damaged by the etching process to form the contact holes C. During this plasma treatment process, a plasma source may reach the damaged region DM2 through the contact holes C. Through this process, the adsorbed and/or solidified impurities may be effectively removed and the damaged lattice may be effectively cured. The plasma source used in this process may be an inert gas such as helium (He), argon (Ar), and/or xenon (Xe). In the case of the surface of the first SiGe epitaxial layer 250 as in the present example embodiment, argon (Ar) or xenon (Xe) having a relatively large atom size may be effectively used as a plasma source.

Specific process conditions appropriately selected from the condition range proposed in the former example embodiment may be used.

Subsequently, as illustrated in FIGS. S32A and 32B, a second SiGe epitaxial layer 252 may be formed in the region of the first SiGe epitaxial layer 250 exposed to the contact holes C.

During this selective epitaxial growth process, a selective etching gas is supplied together with a silicon and germanium source, whereby the second SiGe epitaxial layer 252 may be grown on the exposed region of the first SiGe epitaxial layer 250, while being restrained from growing on the surface of the interlayer dielectric 285.

The second SiGe epitaxial layer 252 may compensate for compressive stress reduced due to the partial removal of the first SiGe epitaxial layer 250 in the previous process. To this end, the second SiGe epitaxial layer 252 may contain Ge having a high concentration. When the first SiGe epitaxial layer 250 is $Si_{1-x}Ge_x$ and the second SiGe epitaxial layer 252 is $Si_{1-y}Ge_y$, the content of germanium in the second SiGe epitaxial layer 252, y, may be greater than the content of germanium in the first SiGe epitaxial layer 250, x.

Figure 33A:
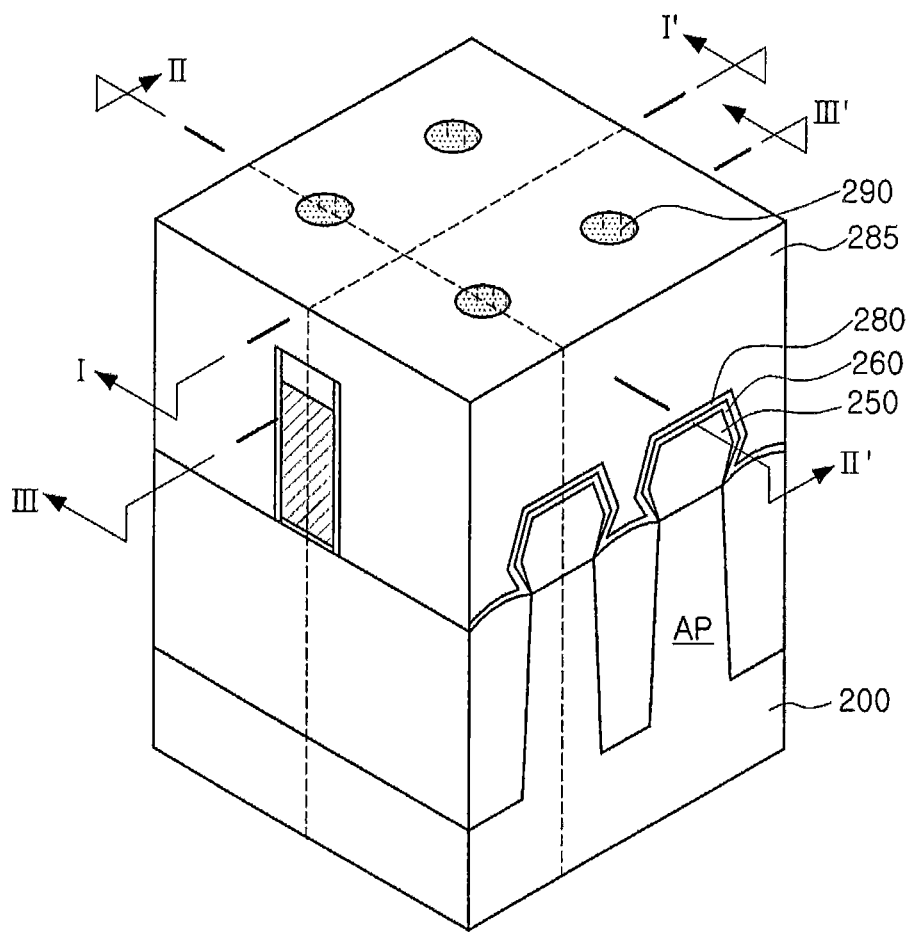
Figure 33B:
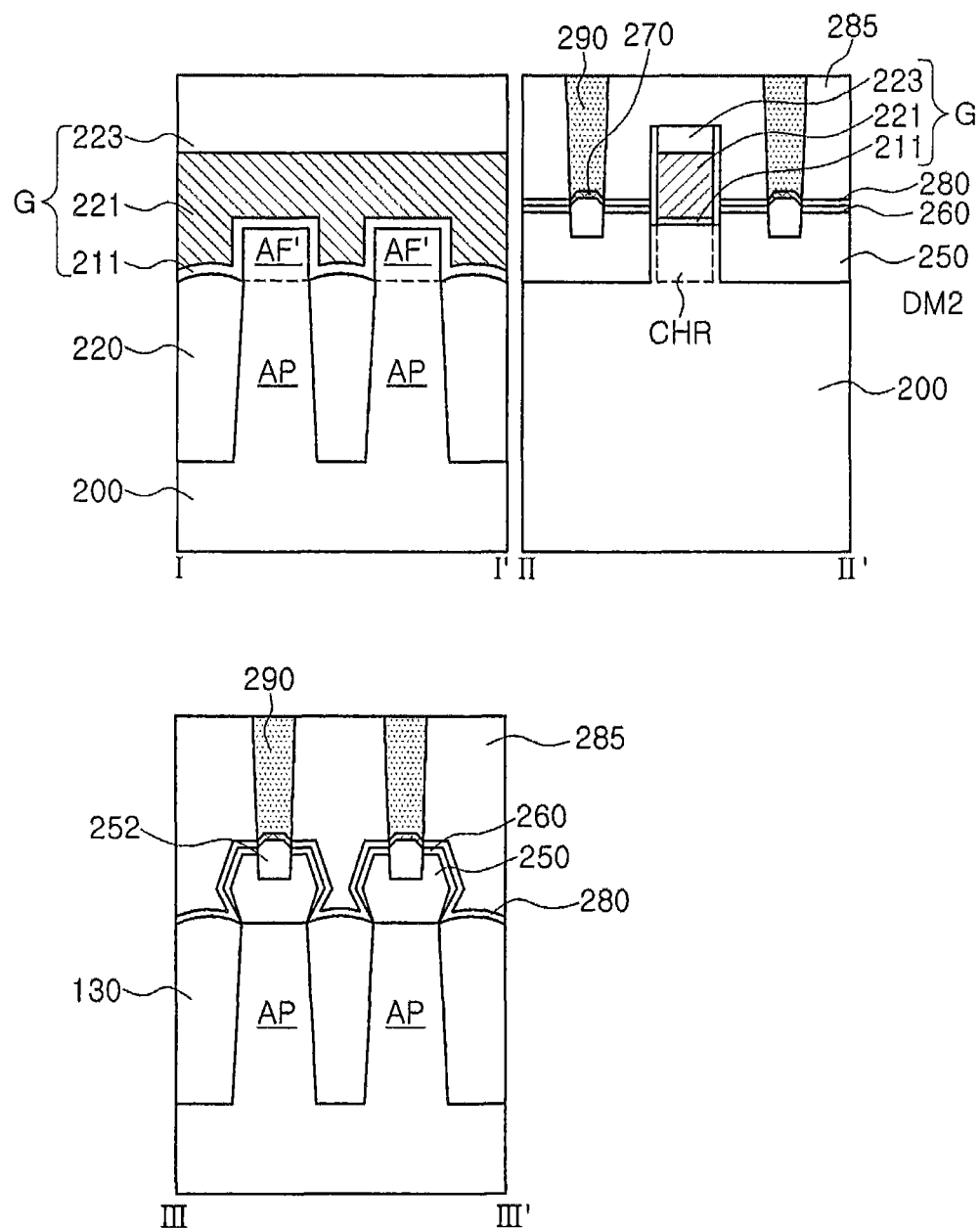

Subsequently, as illustrated in FIGS. 33A and 33B, silicide, films 270 may be formed in the epitaxial regions exposed to the contact holes C, and a conductive material may be embedded in the contact holes C to form contact plugs 290 in contact with the silicide films 270.

Figure 34:
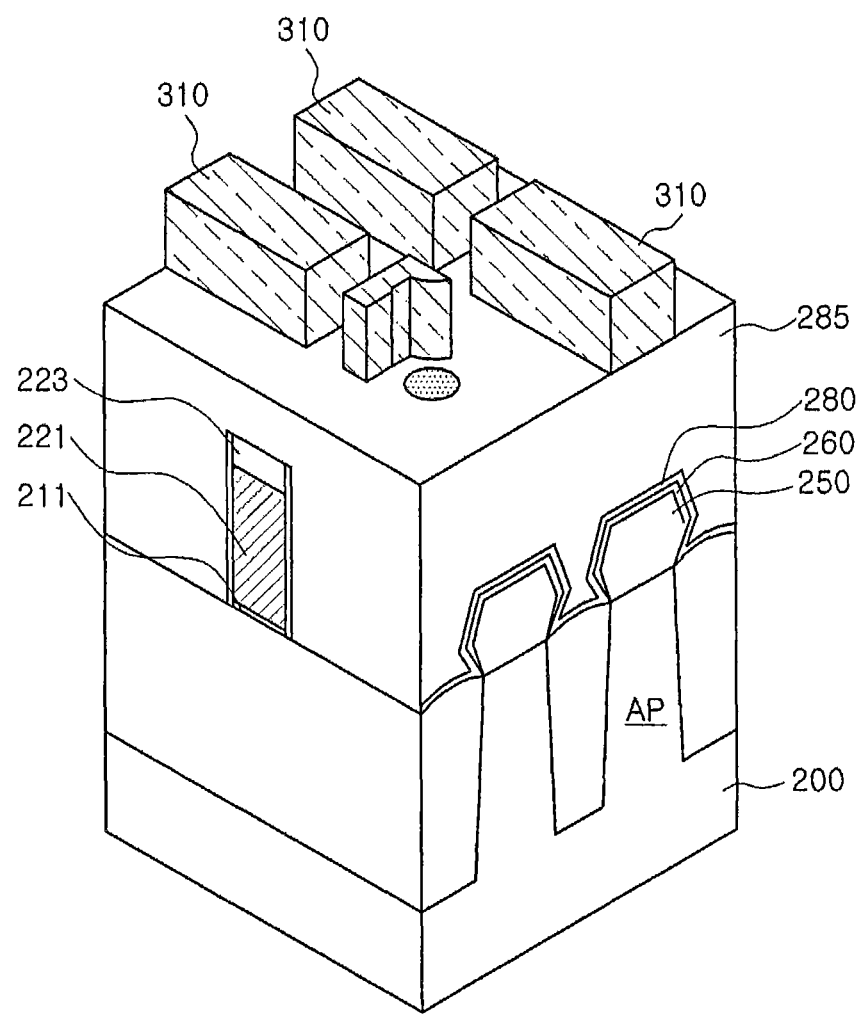
FIG. 34 is a perspective view schematically illustrating a semiconductor device according to various embodiments of the present inventive concepts.

During this process, a metal film may be conformally formed on the interlayer dielectric 285 and a heat treatment process may be performed thereon to react the metal film with silicon or silicon germanium to form the silicide films 270. Subsequently, an unreacted metal film may be removed to obtain the configuration illustrated in FIG. 17. Subsequently, an unreacted metal film may be removed. As in the present example embodiment, during the heat treatment process, the silicon capping layer 260 together with a partial region of the second SiGe epitaxial layer 252 may form the silicide films 270. Unlike the present example embodiment, after the formation of the second SiGe epitaxial layer 252, an additional silicon capping layer may be formed within the contact holes C, and a silicide film may be formed by using the silicon capping layer. In this case, the formation of the silicon capping layer 260 positioned on the first SiGe epitaxial layer 250 in the previous process may be omitted. Thereafter, as illustrated in FIG. 34, line structures 310 connected to the source and drain regions through the silicide films 270 and the contact plugs 290 may be formed.

In order to confirm the improved effect achieved by applying a plasma pre-treatment before a selective epitaxial growth, some experiments were conducted.

EXPERIMENTAL EXAMPLE 1

SEG Process After Formation of Recesses

After the recesses are formed in the SiGe active fins (please refer to FIGS. 25A and 25B), plasma was generated under different conditions, as provided in Table 1, to perform a surface treatment on the recesses (please refer to FIGS. 26A and 26B). SiGe was selectively grown in the surface-treated recess regions under the same process conditions as described in regard to FIGS. 27A and 27B).

TABLE 1

Figure 35A:
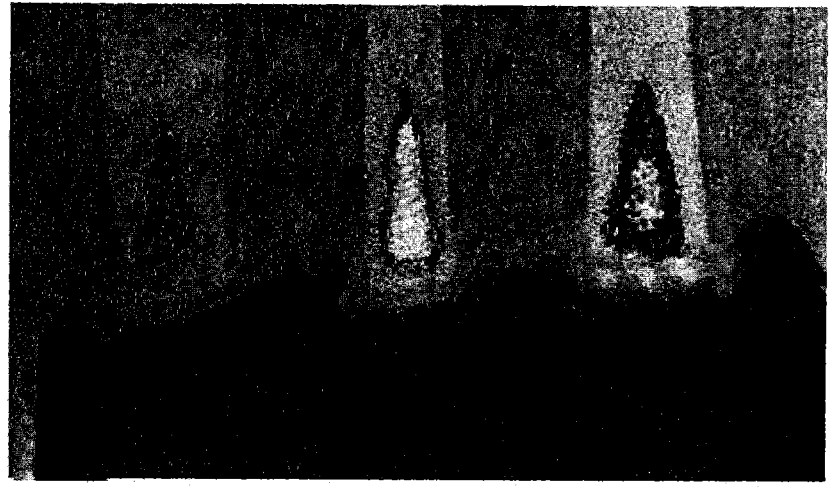
Figure 35B:
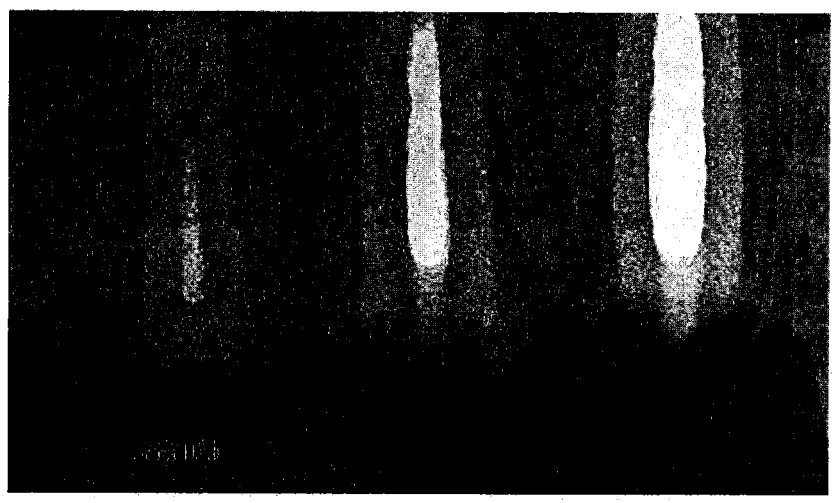

| Classi-<br>fication | Plasma<br>source | Power<br>(kW) | Pressure<br>(Torr) | Photographs of<br>outcomes | Evaluation of<br>SiGe epitaxial<br>growth |
|---|---|---|---|---|---|
| Sample 1 | N$_2$ | 2000 | 1 | FIG. 35A | Bad |
| Sample 2 | Ar | 2000 | 1 | FIG. 35B | Good |
| Sample 3 | Ar | 1200 | 5 | FIG. 35C | Better |

As shown in Table 1, SiGe grown in samples 2 and 3 was processed using Ar plasma, unlike sample 1 which was processed using N$_2$. In particular, it can be seen that SiGe was grown on the entire surface of the recesses in sample 3.

EXPERIMENTAL EXAMPLE 2

SEG Process After Formation of Contact Holes

Two samples (A and B) were manufactured under the same conditions, except for a plasma treatment. First, contact holes extending to an SiGe epitaxial layer were formed in an interlayer dielectric. During a contact hole formation process, a partial region of the SiGe epitaxial layer was removed. Subsequently, sample A did not undergo a plasma treatment, while sample B was subjected to plasma treatment conditions substantially identical to those of sample 3 in Example 1, above. Thereafter, an SiGe epitaxial layer was additionally grown in the SiGe epitaxial region exposed to the contact holes under the same process conditions.

Figure 36A:
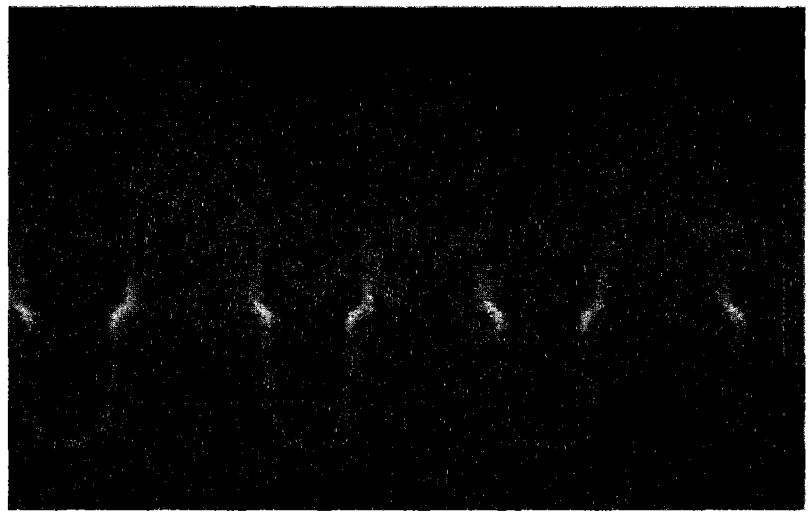
FIGS. 36A and 36B are TEM photographs illustrating selective SiGe growth results after contact etching according to various embodiments of the present inventive concepts.
Figure 36B:

The result of growing the additional SiGe epitaxial layer of samples A and B can be seen in FIGS. 36A and 36B, respectively. As illustrated in FIG. 36A, it can be seen that sample A was contaminated with impurities during the contact hole formation process and the lattice was damaged. Thus, a normal epitaxial layer was rarely grown in sample A. In contrast, in sample B, it can be seen in FIG. 36B that a SiGe epitaxial layer was grown. These results show that impurities on the etched surface were removed and damaged lattice was cured by the Ar plasma treatment.

Figure 37:
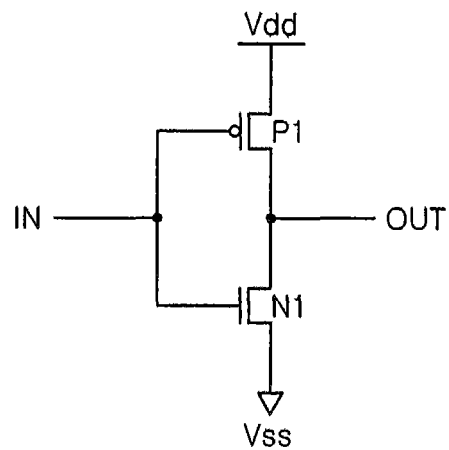
FIG. 37 is a circuit diagram of an inverter in which a semiconductor device according to various embodiments of the present inventive concepts may be employed.

FIG. 37 is a circuit diagram of a CMOS inverter including a semiconductor device according to various embodiments of the present inventive concepts.

Referring to FIG. 37, the CMOS inverter. may include a PMOS transistor P1 and an NMOS transistor N1. The PMOS transistor P1 may be one of the semiconductor devices according to the example embodiments of the present disclosure described above. The PMOS and NMOS transistors may be connected in series between a source voltage line Vdd and a ground voltage line Vss, and input signals may be commonly input to gates of the PMOS and NMOS transistors. Output signals may be commonly output from drains of the PMOS and NMOS transistors. A driving voltage may be applied to a source of the PMOS transistor, and a ground voltage may be applied to a source of the NMOS transistor. The CMOS inverter may invert an input signal IN and output the inverted signal as an output signal OUT. In other words, when a logic level "1" is input as an input signal of the inverter, a logic level "0" may be output as an output signal, and when a logic level "0" is input as an input signal of the inverter, a logic level "1" may be output as an output signal.

Figure 38:
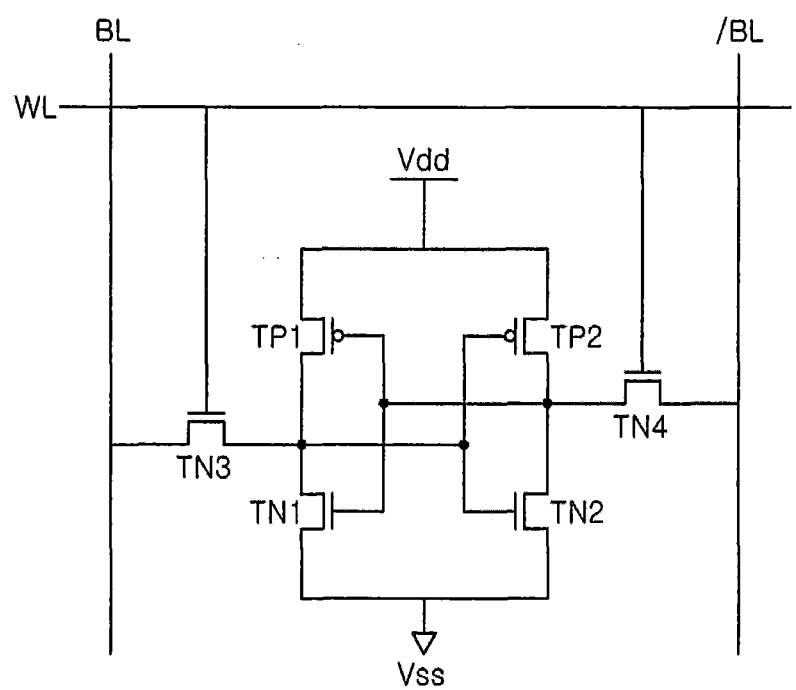
FIG. 38 is a circuit diagram of an SRAM cell in which a semiconductor device according to various embodiments of the present inventive concepts may be employed.

FIG. 38 is a circuit diagram of a SRAM cell including a semiconductor device according to various embodiments of the present inventive concepts.

Referring to FIG. 38, in an SRAM device, one cell may include first and second driving transistors TN1 and TN2, first and second load transistors TP1 and TP2, and first and second access transistors TN3 and TN4. Here, sources of the first and second driving transistors TN1 and TN2 may be connected to a ground voltage line Vss, and sources of the first and second load transistors TP1 and TP2 may be connected to a source voltage line Vdd.

The first driving transistor TN1 configured as an NMOS transistor and the first load transistor TP1 configured as a PMOS transistor may form a first inverter, and the second driving transistor TN2 configured as an NMOS transistor and the second load transistor TP2 configured as a PMOS transistor may form a second inverter. The first and second load transistors configured as PMOS transistors may be one of the semiconductor devices according to the example embodiments of the present disclosure described above.

Output terminals of the first and second inverters may be connected to sources of the first access transistor TN3 and the second access transistor TN4. Also, in order to provide a single latch circuit, input terminals and output terminals of the first and second inverters may be connected in a crossing manner. Drains of the first and second access transistors TN3 and TN4 may be connected to first and second bit lines BL and /BL, respectively.

Figure 39:
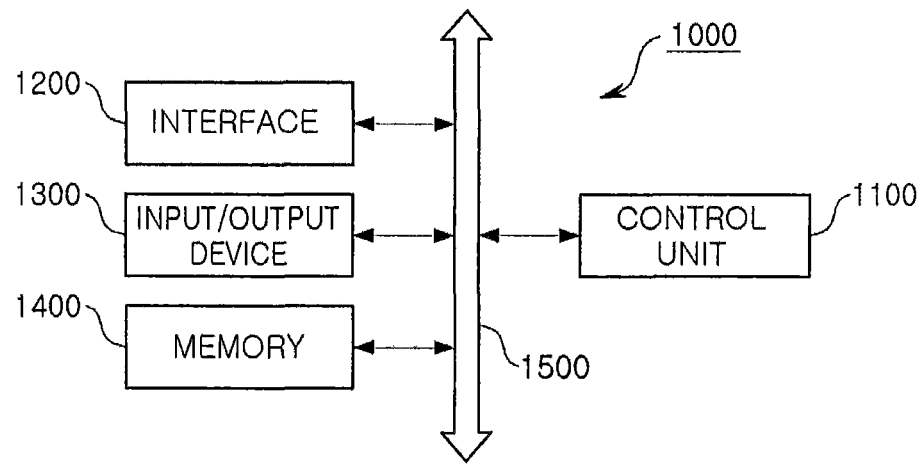
FIGS. 39 and 40 are block diagrams illustrating an electronic device and a storage device in which a semiconductor device according to various embodiments of the present inventive concepts may be employed.
Figure 40:
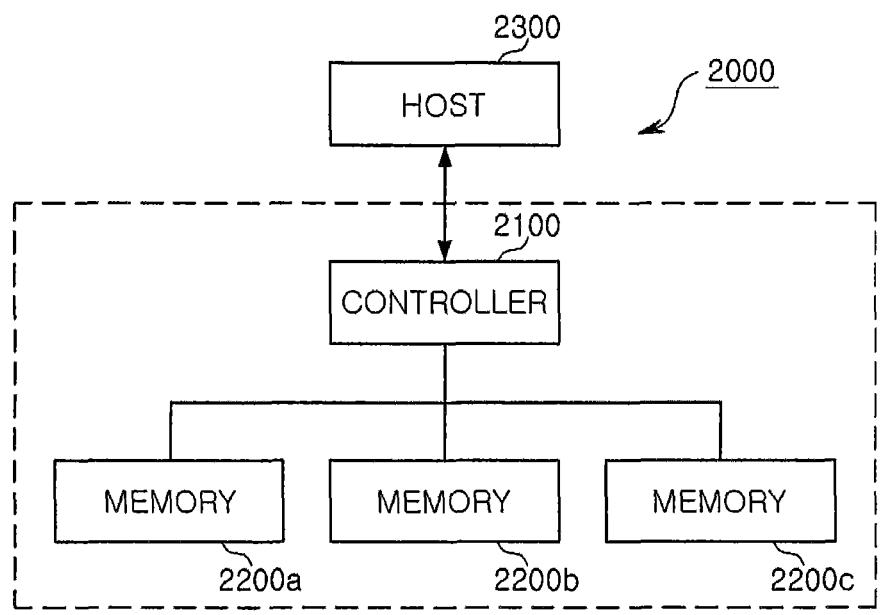

FIGS. 39 and 40 are block diagrams illustrating an electronic device and a storage device including a semiconductor device according to various embodiments of the present inventive concepts.

Referring to FIG. 39, an electronic device 1000 including a semiconductor device according to an example embodiment of the present disclosure may include a control unit 1100, an interface 1200, an input/output device 1300, a memory 1400, and the like. The control unit 1100, the interface 1200, the input/output device 1300, the memory 1400, and the like, may be connected via a bus BUS 1500 providing a passage through which data is delivered.

The control unit 1100 may include a device such as at least one microprocessor, digital signal process, microcontrol unit, and the like. The memory 1400 may include a device that may read and write data in various manners. The control unit 1100 and the memory 1400 may include at least one of the semiconductor devices according to the example embodiments of the present disclosure described above.

The input/output device 1300 may include a keypad, a keyboard, a touch screen device, a display device, an audio input/output module, and the like. The interface 1200 may be a module for transmitting and receiving data via a communication network, and may include an antenna, a wired/wireless transceiver, or the like. Besides the components illustrated in FIG. 39, the electronic device 1000 may further include an application chip set, an imaging device, and the like. The electronic device 1000 illustrated in FIG. 39 is not limited in category, and may be various devices such as a personal digital assistant (PDA), a portable computer, a mobile phone, a wireless phone, a laptop computer, a memory card, a portable multimedia player, a tablet PC, and the like.

Referring to FIG. 40, a storage device 2000 including a semiconductor device according to an example embodiment of the present disclosure may include a controller 2100 communicating with a host 2300 and memories 2200a, 2200b, and 2200c storing data. The controller 2100 and the memories 2200a, 2200b, and 2200c may include at least one of the semiconductor devices according to example embodiments of the present disclosure.

The host 2300 communicating with the controller 2100 may be various electronic devices in which the storage device 2000 is installed. For example, the host 2300 may be a smartphone, a digital camera, a desktop computer, a laptop computer, a portable media player, and the like. The controller 2100 may receive a data, write or read a request delivered from the host 2300, and store data in the memories 2200a, 2200b, and 2200c, or may generate a command for retrieving data from the memories 2200a, 2200b, and 2200c.

As set forth above, according to various embodiments of the present inventive concepts, by using an inert gas plasma to process a surface to which selective epitaxial growth or regrowth is to be applied, impurities may be removed and/or lattice may be repaired.

For example, in the case of silicon germanium (SiGe), when it is etched, the lattice may be damaged and impurities having a high concentration may be adsorbed onto a surface thereof due to residues. By performing surface treatment with plasma of an inert gas such as argon (Ar) or xenon (Xe), impurities may be effectively removed and the lattice may be repaired. The present disclosure may be advantageously used in a FET using silicon germanium as a stressor.

While example embodiments have been shown and described above, it will be apparent to those skilled in the art that modifications and variations could be made without departing from the scope of the present inventive concepts as defined by the appended claims That which is claimed is:

1. A method of manufacturing a semiconductor device, the method comprising:
   forming a gate electrode structure on an active region of a semiconductor substrate;
   forming recesses in regions positioned on both sides of the gate electrode structure on the active region of the semiconductor substrate;
   performing a pre-treatment on the recesses using an inert gas plasma to provide pre-treated recesses;
   growing an epitaxial layer on the pre-treated recesses; and
   forming an electrode structure on the epitaxial layer,
   wherein performing the pre-treatment on the recesses comprises generating the inert gas plasma by applying power in a range of 800 kW to 4000 kW and the inert gas plasma includes at least one argon (Ar) and xenon (Xe).

2. The method of claim 1, wherein the active region of the semiconductor substrate includes silicon or silicon germanium.

3. The method of claim 1, wherein the epitaxial layer includes a silicon germanium epitaxial layer.

4. The method of claim 3, wherein the silicon germanium epitaxial layer is doped with a p-type impurity.

5. The method of claim 1, wherein the pre-treatment on the recesses is performed for a period of time in a range of 10 seconds to 300 seconds.

6. The method of claim 1, wherein after forming the recesses in regions positioned on both sides of the gate electrode structure on the active region of the semiconductor substrate, residues remain on a surface of the recesses, and the method further comprises cleaning the residues before performing the pre-treatment on the recesses.

7. The method of claim 1, further comprising, after performing the pre-treatment on the recesses,
   oxidizing or nitrificating surfaces of the pre-treated recesses to provide oxidized or nitrificated surfaces, and
   cleaning the oxidized or nitrificated surfaces.

8. The method of claim 1, wherein the active region has an active fin structure having an upper surface and two opposing lateral surfaces, and the gate electrode structure intersects the active fin structure and is in contact with the upper surface and the two opposing lateral surfaces of the active fin structure.

9. The method of claim 1, wherein the pretreatment is performed at a pressure in a range of 0.1 torr to 10 torr.

10. A method of manufacturing a semiconductor device, the method comprising:
    forming a gate electrode structure on an active region of a semiconductor substrate;
    forming recesses in regions positioned on both sides of the gate electrode structure on the active region of the semiconductor substrate;
    growing a first epitaxial layer on the recesses;
    forming an interlayer dielectric on the semiconductor substrate covering the active region of the semiconductor substrate and the first epitaxial layer;
    forming a contact hole on the interlayer dielectric, to expose an area of the first epitaxial layer;
    performing a pre-treatment on the exposed area of the first epitaxial layer with a first inert gas plasma to provide a pre-treated contact area of the first epitaxial layer;
    growing a second epitaxial layer on the pre-treated contact area of the first epitaxial layer; and
    forming an electrode structure on the second epitaxial layer,
    wherein the first and second epitaxial layers include a silicon geranium epitaxial layer.

11. The method of claim 10, further comprising, between forming the recesses and growing the first epitaxial layer, performing a pre-treatment on the recesses using a second inert gas plasma.

12. The method of claim 10, wherein the active region of the semiconductor substrate includes silicon or silicon germanium.

13. The method of claim 10, wherein the first epitaxial layer is $Si_{1-x}Ge_x$ and the second epitaxial layer is $Si_{1-y}Ge_y$, wherein x and y have a value of $0<x<y<1$.

14. The method of claim 10, wherein forming the electrode structure comprises:
forming a silicide layer on the second epitaxial layer; and
filling the contact hole with an electrode material.

15. A method of preparing a semiconductor substrate for a selective epitaxial growth process, the method comprising:
providing a semiconductor substrate comprising a gate electrode structure and at least two recesses, the at least two recesses on opposing sides of the gate electrode structure;
pre-treating the at least two recesses with a first inert gas plasma to provide at least two pre-treated recesses; and
growing an epitaxial layer on the at least two pre-treated recesses,
wherein the pre-treating is performed at a pressure in a range of 0.1 torr to 10 torr and comprises applying power in a range of 800 kW to 4000 kW.

16. The method of claim 15, wherein the inert gas plasma comprises helium, argon, and/or xenon.

17. The method of claim 15, wherein the semiconductor substrate comprises silicon or silicon germanium.

18. The method of claim 15, further comprising pre-treating a surface of the epitaxial layer with a second inert gas plasma.

19. The method of claim 18, wherein pre-treating the surface of the epitaxial layer with the second inert gas plasma comprises applying power in a range of 800 kW to 4000 kW.

20. The method of claim 10, wherein the pretreatment is performed at a pressure in a range of 0.1 torr to 10 torr.

* * * * *